United States Patent [19]
Makiuchi et al.

[11] Patent Number: 5,107,318
[45] Date of Patent: Apr. 21, 1992

[54] SEMICONDUCTOR DEVICE HAVING LIGHT RECEIVING DIODE ELEMENT WITH CAPACITANCE

[75] Inventors: Masao Makiuchi, Yamato; Hisashi Hamaguchi, Hadano, both of Japan

[73] Assignee: Fujitsu Limited, Kawasaki, Japan

[21] Appl. No.: 684,394

[22] Filed: Apr. 12, 1991

[30] Foreign Application Priority Data

| Apr. 16, 1990 [JP] | Japan | 2-97489 |
| Jul. 2, 1990 [JP] | Japan | 2-172661 |
| Nov. 30, 1990 [JP] | Japan | 2-340151 |

[51] Int. Cl.$^5$ ............................................. A01L 27/14
[52] U.S. Cl. .......................... 357/30; 357/58; 357/56; 357/15; 357/16; 357/55; 357/51; 357/22
[58] Field of Search ........... 357/30 P, 58, 30 G, 357/30 M, 56, 30 E, 30 C, 15, 16, 55, 22, 51, 22 B, 22 C

[56] References Cited

U.S. PATENT DOCUMENTS

| 4,634,883 | 1/1987 | Nishiura et al. | 250/578 |
| 4,885,622 | 12/1989 | Nomoto et al. | 250/578 |
| 5,004,903 | 4/1991 | Kitamura et al. | 357/30 P X |

FOREIGN PATENT DOCUMENTS

| 1-194352 | 8/1989 | Japan | 357/30 E |
| 1259578 | 10/1989 | Japan | 357/30 E |
| 2212020 | 12/1989 | United Kingdom . | |

OTHER PUBLICATIONS

Ota et al., "Twelve-Channel Individually Addressable InGaAs/InP p-I-n Photodiode and In GaAs/InP LED Arrays in a Compact Package", *Journal of Lightwave Technology*, vol. LT-5, No. 8, Aug. 1987, pp. 1118–1122.

Kaede et al., "12-Channel Parallel Optical-Fiber Transmission Using a Low-Drive Current 1.3 μm LED Array and a p-i-n PD Array", *Journal of Lightwave Technology*, vol. 8, No. 6, Jun. 1990, pp. 883–888.

*Primary Examiner*—William Mintel
*Attorney, Agent, or Firm*—Staas & Halsey

[57] ABSTRACT

A semiconductor device includes a substrate, a first layer formed on the substrate and made of a semiconductor of a first conductive layer, a second layer formed on the first layer and functioning as a photoabsorption layer, a third layer formed on the second layer and made of a semiconductor of the first conductive type, a plurality of regions formed in the third layer and made of a semiconductor of a second conductive type opposite to the first conductive type thereby forming a plurality of pin diodes, where each of the regions at least reaches the second layer, and a plurality of electrodes respectively formed on the regions and made of the same electrode material. A first electrode of the plurality of electrodes receives a positive voltage to forward bias a first pin diode of the plurality of pin diodes and a second electrode of the plurality of electrodes receives a negative voltage to reverse bias a second pin diode of the plurality of pin diodes so that the second pin diode operates as a pin photodiode.

42 Claims, 17 Drawing Sheets

SEMICONDUCTOR DEVICE HAVING LIGHT RECEIVING DIODE ELEMENT WITH CAPACITANCE

BACKGROUND OF THE INVENTION

The present invention generally relates to semiconductor devices and methods of producing the same, and more particularly to a semiconductor device having pin photodiodes and a method of producing such a semiconductor device.

When assembling or adjusting an optical communication system, it is becoming necessary to directly monitor an optical output of a semiconductor laser using an ultra high-speed semiconductor light receiving element which has a response speed of 30 GHz or greater because of the high transmission speed of optical signals used.

Generally, in order to increase the response speed of a pin photodiode, the diameter of the pin junction is reduced and the thickness of an i-type photoabsorption semiconductor layer is reduced. When such a measure is taken and the response speed is 30 GHz or greater, the diameter of the pin junction becomes 20 μm or less and the thickness of the i-type photoabsorption semiconductor layer becomes 1 μm or less.

As described above, it is difficult to produce a pin photodiode having a small pin junction diameter and a thin i-type photoabsorption semiconductor layer. But it is also extremely difficult to obtain an electrical signal which is obtained by a photoelectric conversion from such a small pin photodiode without signal deterioration for the following reasons. That is, the operating part of the pin photodiode itself can be made considerably small by using the present techniques for producing semiconductor devices. However, there is a limit to reducing the length and overall size of the wire bonding part which is used to obtain the electrical signal. As a result, there is also a limit to reducing the electrostatic capacitance and inductance.

On the other hand, for a pin photodiode having a pin junction diameter of 15 μm and a photoabsorption layer with a thickness of 1.4 μm and subjected to an ultra high speed optical signal of 20 GHz or greater, it is possible to realize a capacitance of 30 to 40 PF. But such a small photodiode easily breaks when subjected to by a surge voltage or the like.

In order to overcome this problem and realize a high-speed pin photodiode having a high reliability, there is a proposed pin photodiode which is provided with a chip capacitor. The chip capacitor is provided adjacent to the pin photodiode chip and acts as a bypass capacitor for bypassing the surge voltage. However, no matter how close the chip capacitor is provided adjacent to the pin photodiode chip, there is a limit depending on the size of the chip capacitor or the like, and this limit prevents complete elimination of the above described problem. In other words, it is difficult to positively prevent breakdown of the pin photodiode by quickly responding to even an impulse external noise.

The pin photodiode has an i-type region sandwiched between a p-type region and an n-type region. An avalanche photodiode (APD) has an i-type region in which an avalanche breakdown occurs. According to these light receiving elements, the i-type region functions as a photoabsorption layer which absorbs light, and the material used for the photoabsorption layer changes depending on the wavelength of the light used for the optical communication. A description will now be made of the conventional light receiving elements which are designed for optical communication using a light having a wavelength of approximately 1 μm such as 1.3 μm and 1.6 μm.

FIG. 1A shows a conventional pin photodiode. In FIG. 1A, an n+-type InP layer 552 is formed on a semiinsulative InP substrate 551. An undoped InGaAs layer 553 which forms an i-type region for absorbing light is formed on the n+-type InP layer 552. An n−-type InP region 554 is formed on the InGaAs layer 553. A p+-type region 555 is formed within the n−-type InP layer 554 by diffusing Zn, so as to form a pin structure. For example, the n+-type InP layer 552 has a thickness of 2 μm, the InGaAs layer 553 has a thickness of 1.7 μm, and the n−-type InP layer 554 has a thickness of approximately 1 μm which is doped with Si with an impurity concentration of $1 \times 10^{15}$ cm$^{-3}$.

The n−-type InP layer 554 and the InGaAs layer 553 are selectively etched to expose the surface of the n+-type InP layer 552. An n side electrode 557 which is made of AuGe/Au, for example, is formed on the n+-type InP layer 552. On the other hand, a p side electrode 558 which is made of AuZn/Au, for example, is formed on the p+-type region 555. Because both sides of the InGaAs layer 553 which becomes the photoabsorption layer are formed by the InP having a wide band gap, the incident light can be received from the top surface to the bottom surface of the structure. When receiving the incident light from the top surface of the structure, an opening is formed at a central part 559 of the p side electrode 558.

When a predetermined reverse bias voltage is applied across the electrodes 557 and 558 of the pin photodiode shown in FIG. 1A, the InGaAs layer 553 essentially becomes a depletion layer. The electric field within the depletion layer accelerates the electron-hole pairs which are generated by the incident light, thereby causing the holes to be collected at the p side electrode 558 and the electrons to be collected at the n side electrode 557.

FIG. 1B shows a conventional lateral pin photodiode. In FIG. 1B, an undoped InP layer 661 which acts as a buffer layer is formed on the semiinsulative InP substrate 551. An undoped InGaAs layer 662 which acts as a photoabsorption layer is formed on the InP layer 661. An n−-type InP layer 663 is formed on the InGaAs layer 662. Zn is selectively diffused within the n−-type InP layer 663 so as to form a p-type region 664.

The InP layer 661 and the InGaAs layer 662 are made of a substantially intrinsic semiconductor having an impurity concentration of $1 \times 10^{14}$ cm$^{-3}$ or less. For example, the InP layer 661 and the InGaAs layer 662 have thicknesses of approximately 1 μm and 1.7 μm, respectively. For example, the n−-type InP layer 663 has a thickness of approximately 0.3 μm and an impurity concentration of approximately $1 \times 10^{-3}$. A p side electrode 668 which is made of AuZn/Au is formed on the p-type region 664, and an n side electrode 667 which is made of AuGe/Au is formed on the n−-type InP layer 663.

When a predetermined reverse bias voltage is applied across the electrodes 667 and 668 of the lateral pin photodiode shown in FIG. 1B, the pin junction in the periphery of the i-type region 664 becomes reverse biased and a depletion layer 665 spreads as indicated by a dotted line. When the incident light reaches the region of this depletion layer 665 and the electron-hole pairs are generated, the holes are collected at the p side electrode 668 and the electrons are collected at the n side electrode 667.

FIG. 1C shows a conventional metal-semiconductor-metal (MSM) photodiode. In FIG. 1C, the InP layer 661 which acts as the buffer layer is formed on the semiinsulative InP substrate 551 and the InGaAs layer 662 which acts as the photoabsorption layer is formed on the InP layer 661, similarly to the lateral pin photodiode shown in FIG. 1B. An undoped InAlAs layer 771 having a thickness of approximately 0.1 μm is formed on the InGaAs layer 662 for forming a Schottky contact. Schottky electrodes 772 and 773 which are made of Al or the like are formed directly on the InAlAs layer 771. The electrodes 772 and 773 have comb shapes which intermesh with each other, as would be seen in a plan view. When a negative voltage is applied to the electrode 772 and a positive voltage is applied to the electrode 773 as shown, an electric field indicated by arrows is generated from the electrode 773 towards the electrode 772, penetrating the InGaAs layer (photoabsorption layer) 662. When the incident light reaches the InGaAs layer 662 and the electron-hole pairs are generated by the absorption of light, the electrons and holes are accelerated by the electric field and are respectively collected at the electrodes 773 and 772.

According to the pin photodiode shown in FIG. 1A, it is difficult to form the p and n side electrodes 558 and 557 on the same plane and it is inevitable to employ a mesa structure. As a result, it is difficult to integrate the pin photodiode together with other electronic elements.

Furthermore, in the case of the pin photodiode shown in FIG. 1A, it is necessary to use one mask for forming the n side electrode 557 and another mask for forming the p side electrode 558. For this reason, it is necessary to align the masks with a high accuracy particularly as the size of the photodiode becomes smaller, and a poor alignment of the masks would result in a poor performance of the photodiode. In addition, two different electrode materials are used to form the electrodes 557 and 558 using the two different masks, thereby making the production process complex.

In the case of the lateral pin photodiode shown in FIG. 1B, it is difficult to form a depletion layer under one electrode, that is, the n side electrode 667 in the case of the structure shown in FIG. 1B. For this reason, when the light is absorbed in the region where the depletion layer is not developed and the electric field is weak, the carriers cannot move at a high speed and the response speed of the lateral pin photodiode is poor.

According to the MSM photodiode shown in FIG. 1C, a barrier is generated at a hetero interface between the InAlAs layer 771 which forms the Schottky barrier and the InGaAs layer 662 which forms the photoabsorption layer, thereby forming a carrier trap. Consequently, it is difficult to obtain a sufficiently high response speed unless the composition of the InAlAs layer 771 is controlled so that the composition at the interface between the InAlAs layer 771 and the InGaAs layer 662 is close to InGaAs. In addition, a region is generated in which the electric field does not readily develop, immediately under the electrode. When the carriers are generated in such a region, the response speed of the MSM photodiode becomes poor.

SUMMARY OF THE INVENTION

Accordingly, it is a general object of the present invention to provide a novel and useful semiconductor device and method of producing the same, in which the problems described above are eliminated.

Another and more specific object of the present invention is to provide a semiconductor device comprising a substrate, a first layer formed on the substrate and made of a semiconductor of a first conductive type, a second layer formed on the first layer and functioning as a photoabsorption layer, a third layer formed on the second layer and made of a semiconductor of the first conductive type, a plurality of regions formed in the third layer and made of a semiconductor of a second conductive type opposite to the first conductive type thereby forming a plurality of pin diodes, where each of the regions at least reaches the second layer, and a plurality of electrodes respectively formed on the regions and made of the same electrode material, wherein a first electrode of the plurality of electrodes receives a positive voltage to forward bias a first pin diode of the plurality of pin diodes and a second electrode of the plurality of electrodes receives a negative voltage to reverse bias a second pin diode out of the plurality of pin diodes so that the second pin diode operates as a pin photodiode. According to the semiconductor device of the present invention, the electrodes can be formed substantially on the same plane and the semiconductor device can easily be mounted on a part by the so-called flip-chip bonding. In addition, it is possible to form a large electrode with respect to an extremely small pin junction.

Still another object of the present invention is to provide a semiconductor device comprising a substrate, a first layer formed on the substrate and made of a semiconductor, a second layer formed on the first layer and made of a semiconductor of a first conductive type with a first band gap, a third layer formed on the second layer and made of a material having a second band gap which is smaller than the first band gap, the third layer functioning as a photoabsorption layer, a fourth layer formed on the third layer and made of a semiconductor of the first conductive type with an impurity concentration greater than that of the third layer, a plurality of regions formed in the fourth layer and made of a semiconductor of a second conductive type opposite to the first conductive type thereby forming a plurality of pin diodes, each of the regions at least reaching the third layer, and a plurality of electrodes respectively formed on the regions and made of the same electrode material wherein a first electrode of the electrodes is connected to a first region out of the plurality of regions and receives a positive voltage to forward bias a first pin diode of the plurality of pin diodes, the first region has a first area of contact with the fourth layer, a second electrode of the plurality of electrodes is connected to a second region of the plurality of regions and receives a negative voltage to reverse bias a second pin diode of the plurality of pin diodes, the second region has a second area of contact with the fourth layer, and the second area is larger than the first area. According to the semiconductor device of the present invention, the electrodes can be formed substantially on the same plane and the semiconductor device can easily be mounted on a part by the so-called flip-chip bonding. In addition, it is possible to improve the utilization efficiency of the area occupied by the electrodes.

A further object of the present invention is to provide a semiconductor device comprising a substrate, a first layer formed on the substrate and made of a semiconductor, a second layer formed on the first layer and made of a semiconductor of a first conductive type with a first band gap, a third layer formed on the second layer and made of a material having a second band gap which is smaller than the first band gap, wherein the third layer functions as a photoabsorption layer, a fourth layer formed on the third layer and made of a semiconductor of the first conductive type with an impurity concentration greater than that of the third layer, and a plurality of Schottky electrodes respectively formed on the fourth layer in a plurality of regions and made of the same electrode material, wherein a first electrode of the plurality of electrodes is connected to a first region of the plurality of regions of the fourth layer and receives a positive voltage to forward bias a first pin diode out of the pin diodes, the first region has a first area of contact with the fourth layer, a second electrode of the plurality of electrodes is connected to a second region of the plurality of regions of the fourth layer and receives a negative voltage to reverse bias a second pin diode out of the pin diodes, the second region has a second area of contact with the fourth layer, and the second area is larger than the first area. According to the semiconductor device of the present invention, the electrodes can be formed substantially on the same plane and the semiconductor device can easily be mounted on a part by the so-called flip-chip bonding. In addition, it is possible to improve the utilization efficiency of the area occupied by the electrodes.

Another object of the present invention is to provide a semiconductor device comprising a semiinsulative substrate, a first stacked structure formed on the semiinsulative substrate and including layers for forming an electronic element, and a second stacked structure formed on the first stacked structure and including layers for forming an optoelectronic element, wherein the second stacked structure includes a first layer formed on the first stacked structure and made of a semiconductor of a first conductive type with a first band gap, a second layer formed on the first layer and made of a material having a second band gap which is smaller than the first band gap, wherein the second layer functions as a photoabsorption layer, a third layer formed on the second layer and made of a semiconductor of the first conductive type with an impurity concentration greater than that of the second layer, a plurality of regions formed in the third layer and made of a semiconductor of a second conductive type opposite to the first conductive type thereby forming a plurality of pin diodes, wherein each of the regions at least reach the second layer, and a plurality of electrodes respectively formed on the regions and made of the same electrode material. A first electrode of the plurality of electrodes is connected to a first region of the plurality of regions and receives a positive voltage to forward bias a first pin diode out of the plurality of pin diodes, the first region has a first area of contact with the third layer, a second electrode of the plurality of electrodes, is connected to a second region of the plurality of regions and receives a negative voltage to reverse bias a second pin diode out of the pin diodes, the second region has a second area of contact with the third layer, and the second area is larger than the first area.

Still another object of the present invention is to provide a semiconductor device comprising a semiinsulative substrate, a first stacked structure formed on the semiinsulative substrate and including layers for forming an electronic element, and a second stacked structure formed on the first stacked structure and including layers for forming an optoelectronic element, where the second stacked structure includes a first layer formed on the first stacked structure and made of a semiconductor of a first conductive type with a first band gap, a second layer formed on the first layer and made of a material having a second band gap which is smaller than the first band gap, where the second layer functions as a photoabsorption layer, a third layer formed on the second layer and made of a semiconductor of the first conductive type with an impurity concentration greater than that of the second layer, and a plurality of Schottky electrodes respectively formed on the third layer in a plurality of regions and made of the same electrode material. A first electrode of the plurality of electrodes is connected to a first region of the plurality of regions of the third layer and receives a positive voltage to forward bias a first pin diode out of the pin diodes, the first region has a first area of contact with the third layer, a second electrode of the plurality of electrodes is connected to a second region of the plurality of regions of the third layer and receives a negative voltage to reverse bias a second pin diode of the plurality of pin diodes, the second region has a second area of contact with the third layer, and the second area is larger than the first area.

A further object of the present invention is to provide a method of producing a semiconductor device comprising the steps of successively forming, first, second and third layers on a substrate, wherein the first layer is made of a semiconductor of a first conductive type, the second layer functions as a photoabsorption layer and the third layer is made of a semiconductor of the first conductive type, forming a mask layer on the third layer, forming a plurality of openings in the mask layer by etching, implanting impurities into the third layer via the openings of the mask layer to form a plurality of regions made of a semiconductor of a second conductive type opposite to the first conductive type thereby forming a plurality of pin diodes, wherein each of the regions at least reaches the second layer, removing the mask layer, and forming a plurality of electrodes respectively on the regions, wherein the electrodes are made of the same electrode material.

Other objects and further features of the present invention will be apparent from the following detailed description when read in conjunction with the accompanying drawings.

DESCRIPTION OF THE PREFERRED EMBODIMENTS

Figure 1A:
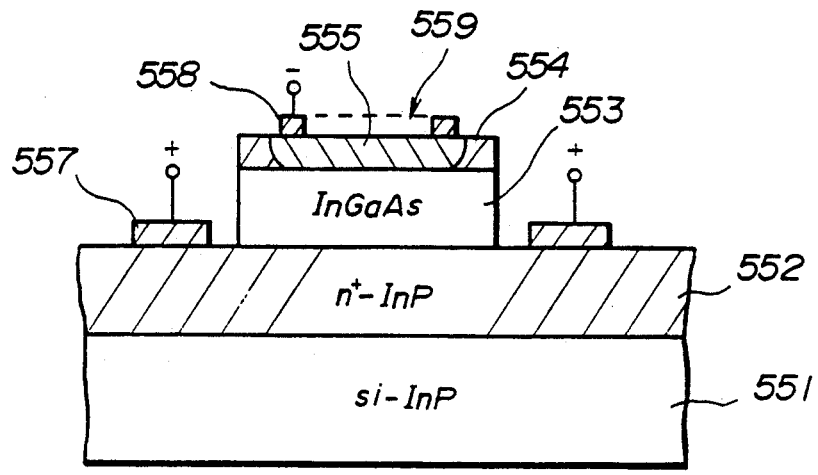
FIG. 1A is a cross sectional view showing an essential part of a conventional pin photodiode.
Figure 1B:
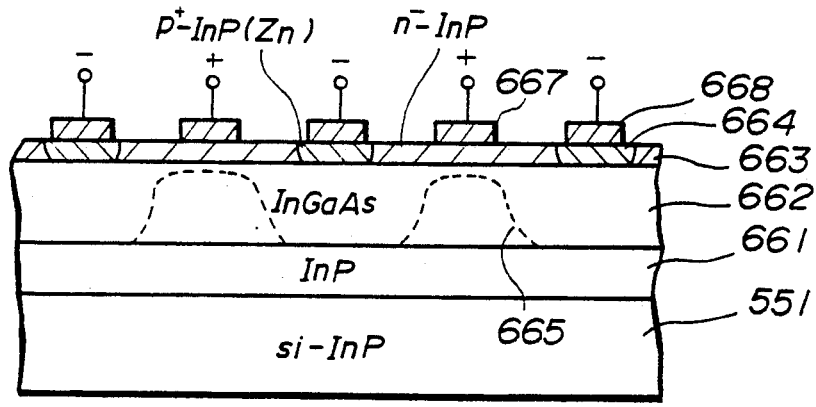
FIG. 1B is a cross sectional view showing an essential part of a conventional lateral pin photodiode.
Figure 1C:
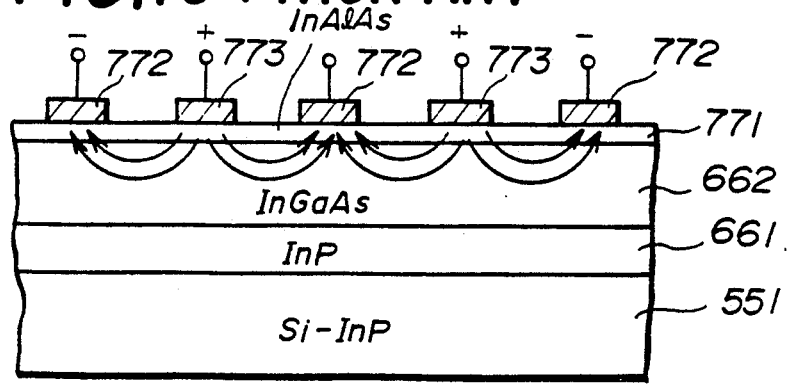
FIG. 1C is a cross sectional view showing an essential part of a conventional MSM photodiode.
Figure 2:
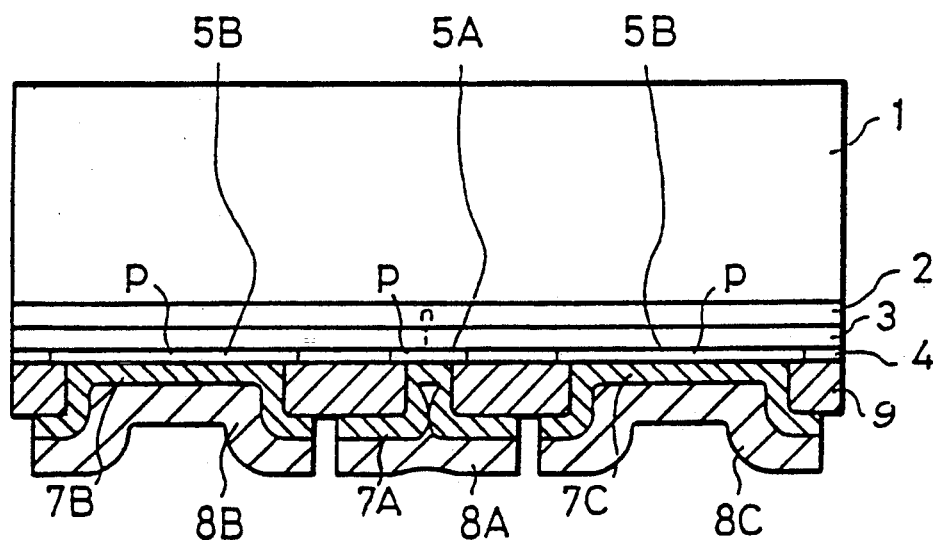
FIG. 2 is a cross sectional view for explaining a first embodiment of the semiconductor device according to the present invention and the operating principle thereof.

First, a description will be given of an operating principle of a first embodiment of the semiconductor device according to the present invention, by referring to FIGS. 2 and 3. FIG. 2 shows a cross section of an essential part of the semiconductor device, and FIG. 3 shows an equivalent circuit of the first embodiment when the necessary connections are made.

The semiconductor device shown in FIG. 2 includes a semiconductor substrate 1, an n-type semiconductor layer 2, an i-type photoabsorption layer 3, an n-type semiconductor (semiinsulative) layer 4, p-type window regions 5A and 5B, an insulating layer 9 made of polyimide, for example, electrodes 7A, 7B and 7C for taking out the photocurrent, and electrodes 8A, 8B and 8C for making the necessary connections. Pin photodiodes PD1, PD2A and PD2B shown in FIG. 3 are formed by making the necessary connections.

The pin photodiode PD1 is made up of the n-type semiconductor layer 2, the i-type photoabsorption layer 3, the p-type window region 5A and the like. As may be seen from the p-type window region 5A, the pin photodiode PD1 has an extremely small pin junction area. On the other hand, the pin photodiodes PD2A and PD2B have considerably large pin junction areas compared to that of the pin photodiode PD1.

Figure 3:
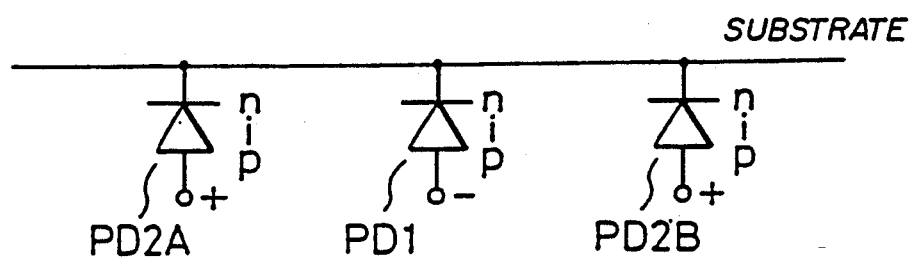
FIG. 3 is a circuit diagram showing an equivalent circuit of the first embodiment shown in FIG. 2.

When operating the semiconductor device as a light receiving element, a bias voltage is applied to the pin photodiodes PD1, PD2A and PD2B with the polarity shown in FIG. 3. In other words, the bias voltage is applied so that the polarity of the electrode 8A becomes negative and the polarity of the electrode 8B becomes positive. As a result, a reverse bias voltage is applied to the pin photodiode PD1, and the pin photodiode PD1 operates as a pin photodiode. On the other hand, a forward bias voltage is applied to each of the pin photodiodes PD2A and PD2B, and the pin photodiodes PD2A and PD2B do not operate as pin photodiodes. The electrostatic capacitances of the pin photodiodes PD2A and PD2B are large because of the considerably large pin junction areas, and the pin photodiodes PD2A and PD2B are essentially short-circuits with respect to a high-frequency electrical signal.

As shown, no stepped portion exists at the top surface of this embodiment due to the mesa etching. For this reason, even when the diameter of the pin junction at the center is 5 to 10 $\mu$m and is extremely small, it is still possible to provide the relatively large electrodes 7A and 8A for taking out the photocurrent. Moreover, since the insulator layer 9 is provided as shown in FIG. 2, the stray capacitance will not increase.

For example, the semiconductor substrate 1 is made of $n^+$-type InP, the n-type semiconductor layer 2 is made of $n^+$-type InP, the i-type photoabsorption layer 3 is made of undoped InGaAs, and the n-type semiconductor layer 4 is made of $n^-$-type InP.

Therefore, the pin photodiodes PD2A and PD2B other than the pin photodiode PD1 which carries out the photoelectric conversion occupy relatively large areas and can provide stable support when mounting the semiconductor device. In addition, since the forward bias voltage is applied to the pin photodiodes PD2A and PD2B, a large photocurrent can be obtained from these pin photodiodes PD2A and PD2B without problems. Furthermore, the structure in this embodiment is particularly suited for the so-called flip-chip bonding, and it is thus possible to minimize the stray inductance and stray capacitance and to prevent characteristic deterioration of the semiconductor device.

Next, a description will be given of a particular structure of the first embodiment, by referring to FIGS. 4 through 6. FIG. 5 shows a plan view of an essential part of the first embodiment, and FIG. 4 shows a cross section taken along a line X—X in FIG. 5.

Figure 4:
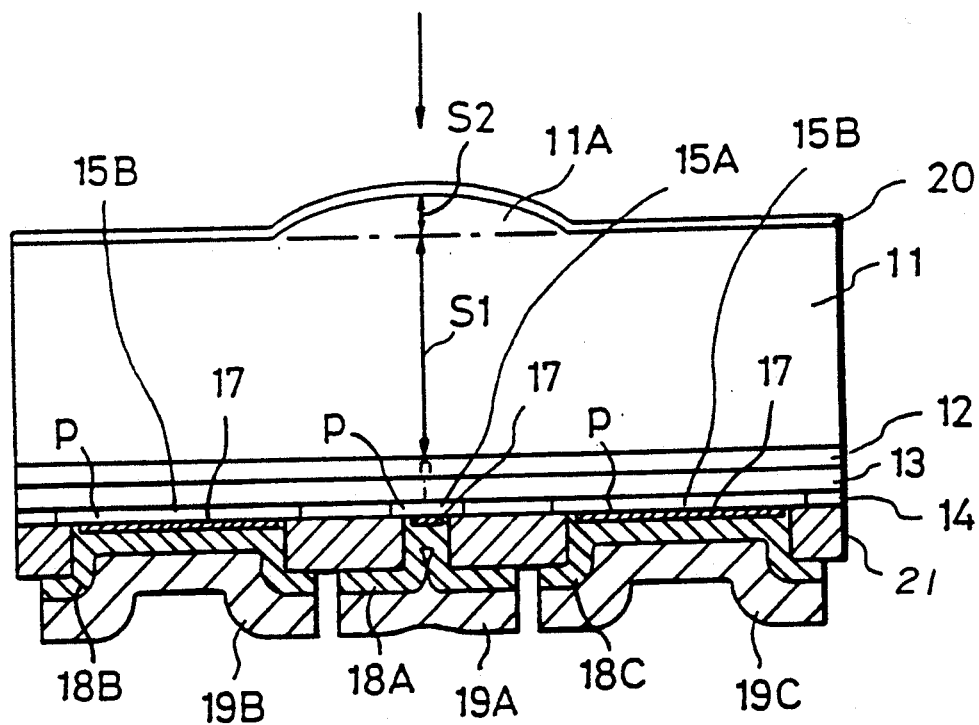
FIG. 4 is a cross sectional view showing an essential part of the first embodiment.
Figure 5:
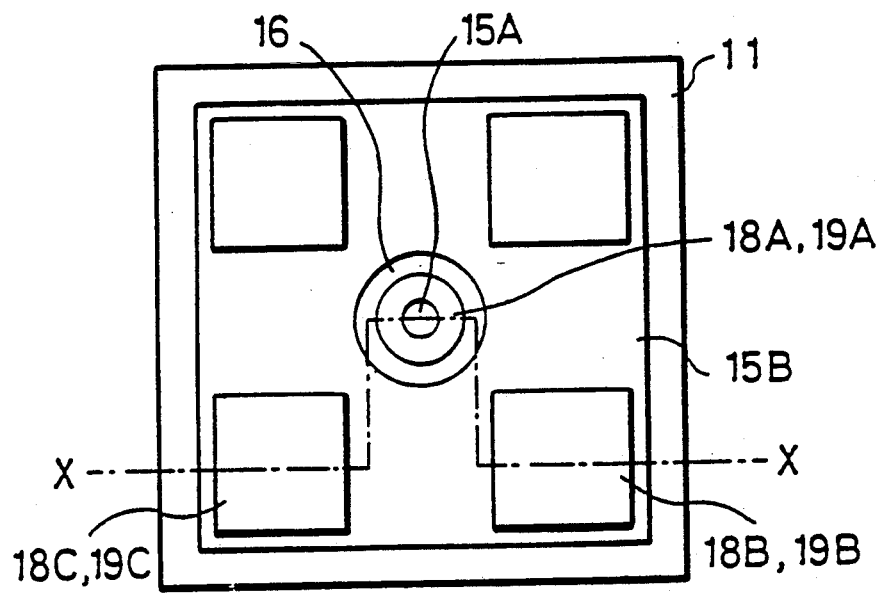
FIG. 5 is a plan view showing an essential part of the first embodiment.

The semiconductor device shown in FIGS. 4 and 5 includes an $n^+$-type InP substrate 11 which includes a micro lens 11A. An $n^+$-type InP layer 12, an undoped InGaAs photoabsorption layer 13, and an $n^-$-type InP layer 14 are successively stacked on the $n^+$-type InP substrate 11. A p-type window region 15A and p-type widow regions 15B are formed in the $n^-$-type InP layer 14. An insulator layer 21 made of polyimide is formed on the $n^-$-type InP layer 14. Electrodes are formed on the p-type window regions 15A and 15B. One electrode which connects to the p-type window region 15A is made up of an ohmic contact metal layer 17, a barrier metal electrode 18A and a connecting electrode 19A. Each electrode which connects to the p-type window region 15B is made up of an ohmic contact metal layer 17, a barrier metal electrode 18B or 18C, and a connecting electrode 19B or 19C. A non-reflecting coating layer 20 is formed on the surface of the $n^+$-type InP substrate 11.

The thickness, impurity concentration and the like of the layers forming the first embodiment are selected as follows, for example. The $n^+$-type InP substrate 11 has a thickness S1 of 70 μm and an impurity concentration of $1 \times 10^{18}$ cm$^{-3}$. The micro lens 11A has a maximum thickness S2 of 6 μm and an aperture diameter of 50 μm. The $n^+$-type InP layer 12 has a thickness of 1.5 μm and an impurity concentration of $1 \times 10^{18}$ cm$^{-3}$. The InGaAs photoabsorption layer 13 has a thickness of 1.4 μm. The $n^-$-type InP layer 14 has a thickness of 1 μm and an impurity concentration of $1 \times 10^{16}$ cm$^{-3}$. The p-type window regions 15A and 15B are doped with Zn as the impurity and have an impurity concentration of approximately $1 \times 10^{18}$ cm$^{-3}$. The insulator layer 21 has a thickness of 2 μm. The ohmic contact metal layer 17 is made up of a AuZn/Au structure. The barrier metal electrodes 18A, 18B and 18C are respectively made up of a Ti/Pt/Au structure. The connecting electrodes 19A, 19B and 19C are respectively made of AuSn.

In this embodiment, the diameter of the pin junction of the pin photodiode which includes the p-type window region 15A (pin photodiode PD1 shown in FIG. 3) is in the range of 5 to 10 μm and thus is extremely small. Hence, the back surface of the substrate 11 is formed as the micro lens 11A having the aperture diameter of 50 μm so as to converge the incident light which is to reach the p-type window region 15A. Although the pin junction below the micro lens 11A is extremely small, no stepped portion exists at the top surface of the semiconductor device. Hence, the electrodes 18A and 19A for use in taking out the photocurrent can be formed to the approximately inverted T-shape which is relatively large, and it is possible to prevent increase of the stray capacitance as described above.

Figure 6:
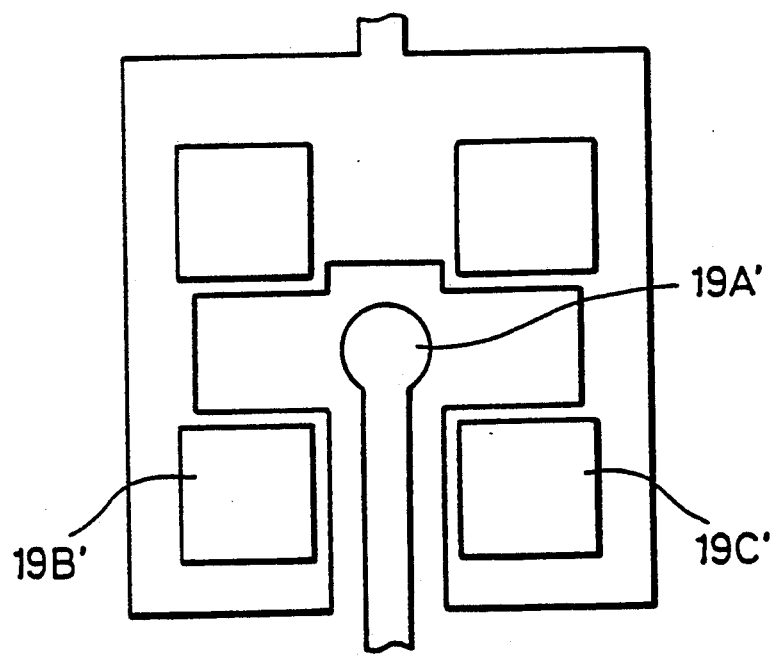
FIG. 6 is a plan view for explaining the mounting of the first embodiment.

FIG. 6 shows a plan view of an essential part of a pattern to which the first embodiment is to be mounted. In FIG. 6, parts 19A′, 19B′ and 19C′ respectively indicate positions where the corresponding electrodes 19A, 19B and 19C are bonded. The bonding of the semiconductor device shown in FIG. 5 onto the pattern shown in FIG. 6 is made by the so-called flip-chip bonding.

The number of connecting electrodes and the arrangement thereof are not limited to those of the fourth embodiment shown in FIG. 5. For example, it is possible to provide three connecting electrodes respectively at the vertexes of a regular triangle. In addition, the connecting electrodes may have different sizes, and the position of the pin photodiode which actually carries out the photoelectric conversion is not limited to the center of the semiconductor device.

Next, a description will be given of an operating principle of a second embodiment of a semiconductor device according to the present invention, by referring to FIGS. 7 and 8.

Figure 7:
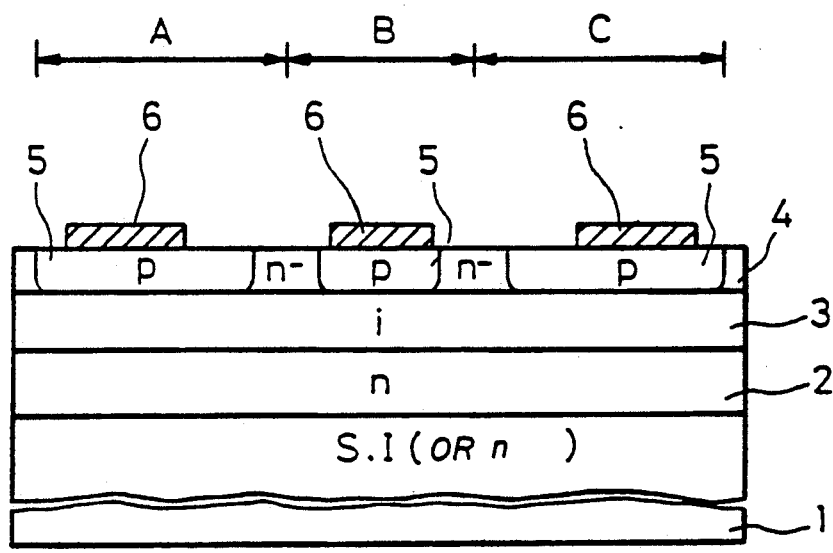
FIG. 7 is a cross sectional view for explaining a second embodiment of the semiconductor device according to the present invention and the operating principle thereof.

In FIG. 7 which shows a cross section of the semiconductor device, a substrate 1 is made of a semiinsulative or conductive semiconductor such as InP and GaAs. In this embodiment, an $n^+$-type semiconductor substrate is used as the substrate 1. An $n^+$-type semiconductor layer 2 which is made of $n^+$-type InP, $n^+$-type AlGaAs or the like is formed on the $n^+$-type substrate 1. A photoabsorption layer 3 which is made of undoped InGaAs, undoped GaAs or the like is formed on the $n^+$-type semiconductor layer 2. An $n^-$-type window layer 4 which is made of $n^-$-type InP, $n^-$-type AlGaAs or the like is formed on the photoabsorption layer 3. A plurality of p-type window regions 5 are formed in the $n^-$-type window layer 4, and an electrode for connection is formed on each p-type window region 5. A, B and C denote pin photodiode parts.

As shown in FIG. 7, the pin photodiode parts A and C are large compared to the pin photodiode part B. In other words, the pin junction area at the pin photodiode parts A and C is large compared to that at the pin photodiode part B.

Figure 8:
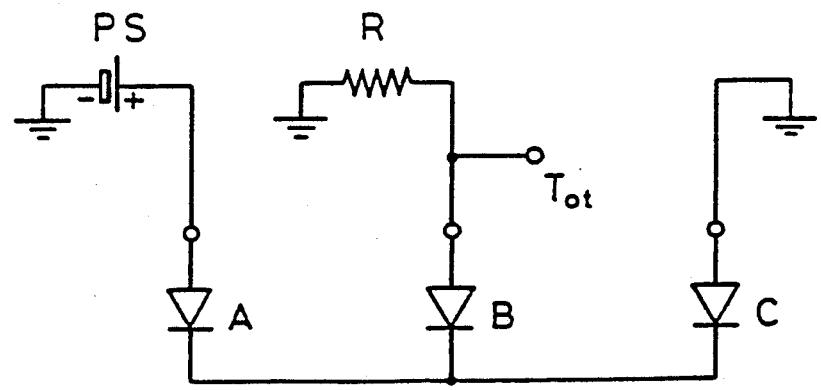
FIG. 8 is a circuit diagram showing an equivalent circuit of the second embodiment shown in FIG. 7.

FIG. 8 shows an equivalent circuit of the semiconductor device shown in FIG. 7 when the necessary connections are made to operate the semiconductor device. In FIG. 8, the same designations are used as in FIG. 7.

As shown in FIG. 8, the pin photodiode part A is connected in a forward direction with respect to a power source PS and acts as a power supply. The pin photodiode part B is applied with a reverse bias voltage and acts as a photodiode itself. The pin photodiode part C is connected in a reverse direction with respect to the power source PS. However, since the pin junction area of the pin photodiode part C is large, the pin photodiode part C acts as a bypass capacitor for bypassing the surge voltage when the surge voltage is applied to the pin photodiode part B which is extremely small.

Figure 9:
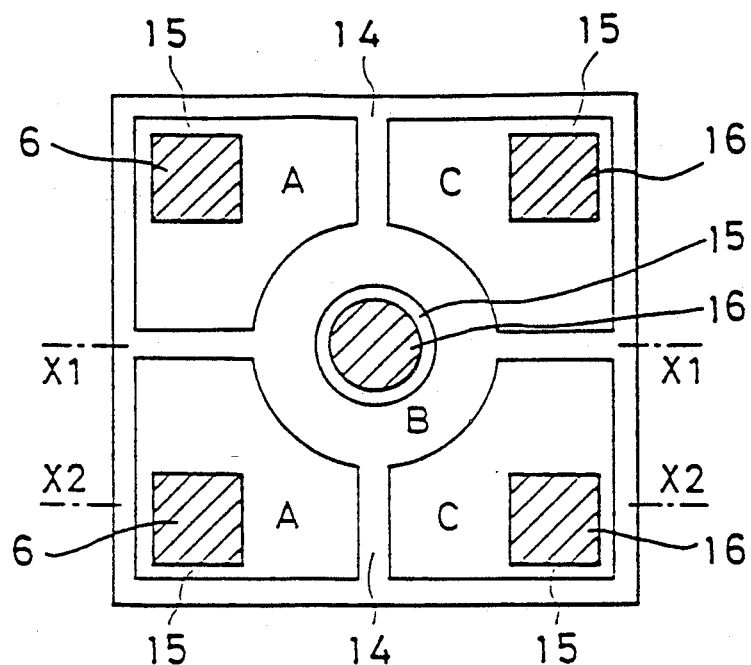
FIG. 9 is a plan view showing an essential part of the second embodiment.
Figure 10:
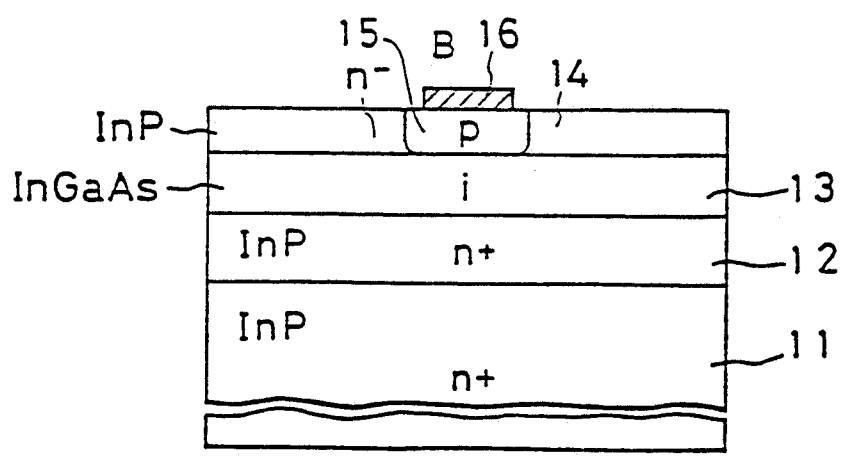
FIG. 10 is a cross sectional view showing the second embodiment along a line X1—X1 in FIG. 9.
Figure 11:
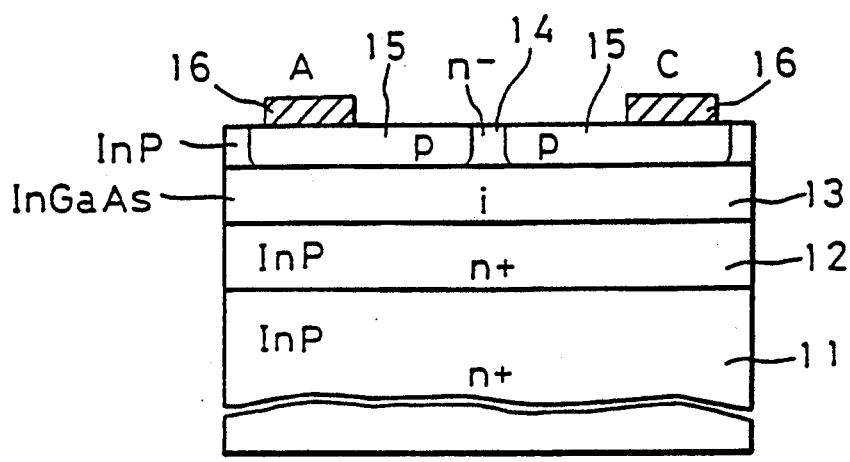
FIG. 11 is a cross sectional view showing the second embodiment along a line X2—X2 in FIG. 9.

Next, a description will be given of a particular structure of the second embodiment, by referring to FIGS. 9 through 11. FIG. 9 shows a plan view of an essential part of the second embodiment. FIGS. 10 and 11 respectively are cross sectional views taken along lines X1—X1 and X2—X2 in FIG. 9.

In this embodiment, an $n^+$-type InP substrate 11 includes S as the impurity and the impurity concentration is $2 \times 10^{18}$ cm$^{-3}$. An $n^+$-type InP layer 12 having a thickness of 1.0 μm includes Si as the impurity and the impurity concentration is $5 \times 10^{17}$ cm$^{-3}$. An undoped InGaAs photoabsorption layer 13 has a thickness of 1.4 μm. An $n^-$-type InP window layer 14 having a thickness of 1 μm includes Si as the impurity and the impurity concentration is $1 \times 10^{18}$ cm$^{-3}$. A p-type window region 15 includes Zn as the impurity and the impurity concentration is $1 \times 10^{18}$ cm$^{-3}$. An electrode 16 uses a contact metal made of a Au/Zn/Au structure, a barrier metal made of a Ti/Pt structure, an electrode draw-out metal made of Au, and a flip-chip bonding material made of AuSn. The thickness of the contact metal is 400 Å/80 Å/120 Å, and the thickness of the barrier metal is 500 Å/3000 Å. The thickness of the electrode draw-out metal is 2000 Å, and the thickness of the flip-chip bonding material is 3 μm.

Figure 12:
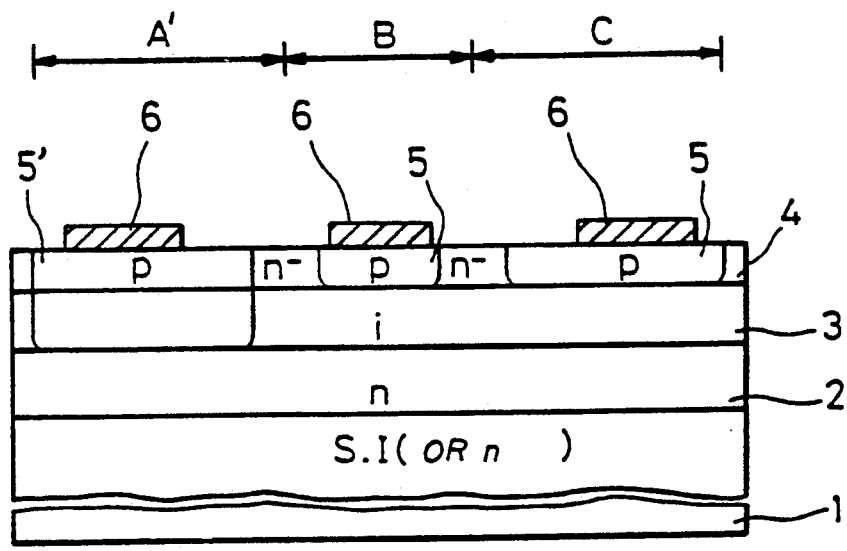
FIG. 12 is a cross sectional view for explaining a third embodiment of the semiconductor device according to the present invention and the operating principle thereof.
Figure 13:
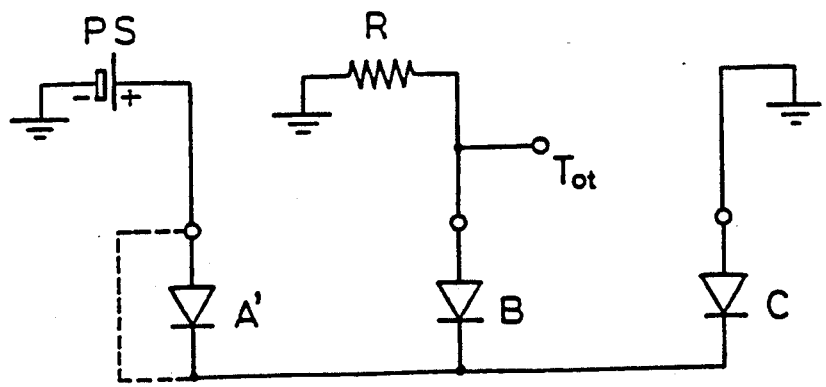
FIG. 13 is a circuit diagram showing an equivalent circuit of the third embodiment shown in FIG. 12.

Next, a description will be given of an operating principle of a third embodiment of the semiconductor device according to the present invention, by referring to FIGS. 12 and 13. In FIGS. 12 and 13, those parts which are the same as those corresponding parts in FIGS. 7 and 8 are designated by the same reference numerals, and a description thereof will be omitted.

In FIG. 12 which shows a cross section of the semiconductor device, a p-type window region 5, is provided in a pn junction diode part A'. This window region 5, may be made of an n-type semiconductor.

In the semiconductor device which functions as a light receiving device, the pin photodiode part A shown in FIG. 7 acts only as an interconnection device for supplying negative voltage to part B. Hence, the i-type photoabsorption layer 3 is unnecessary for the operation of the pin photodiode part A, and the existence of the i-type photoabsorption layer 3 rather generates a forward voltage drop.

For this reason, in the pn junction diode part A' of this embodiment, the p-type window region 5' is made deep to reach the n+-type semiconductor layer 2.

FIG. 13 shows an equivalent circuit of the semiconductor device shown in FIG. 12 when the necessary connections are made to operate the semiconductor device. The equivalent circuit shown in FIG. 13 differs from that shown in FIG. 8 in that the pn junction diode part A' is provided in place of the pin photodiode part A. Of course, when the n-type semiconductor forms the window region 5', the pn junction diode part A, is completely short-circuited as indicated by a broken line in FIG. 13.

Figure 14:
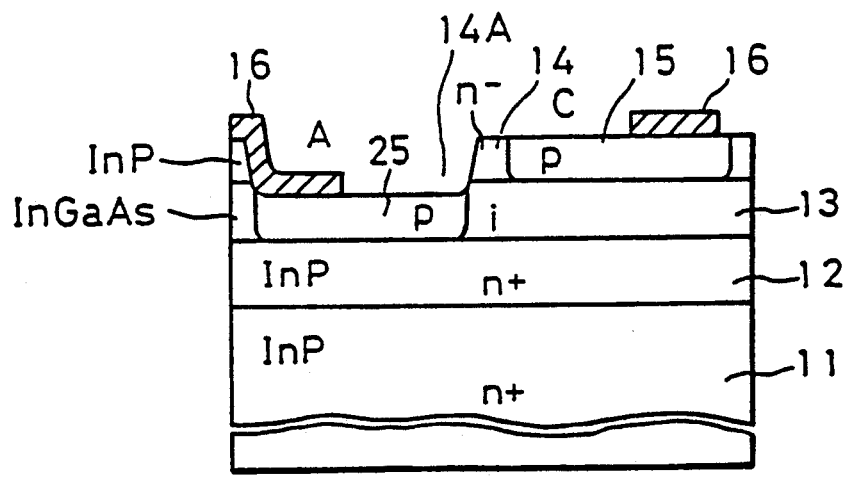
FIG. 14 is a cross sectional view showing an essential part of the third embodiment employing one structure.

Next, a description will be given of a particular structure of the third embodiment, by referring to FIG. 14. In FIG. 14, those parts which are the same as those corresponding parts in FIGS. 9 through 11 are designated by the same reference numerals, and a description thereof will be omitted.

FIG. 14 corresponds to an essential part of the third embodiment along the line X2—X2 shown in FIG. 9 when the structure shown in FIG. 9 is employed. As shown, a depression 14A is formed in the n−-type InP window layer 14. The depression 14A is formed by etching the surface of the n−-type InP window layer 14. A deep p-type window region 25 is formed by an impurity diffusion which is carried out to form the p-type window regions 15 of the pin photodiode parts B and C. Hence, the p-type window regions 15 and 25 are formed simultaneously, although the p-type window region 25 is deeper than the p-type regions 15.

Figure 15:
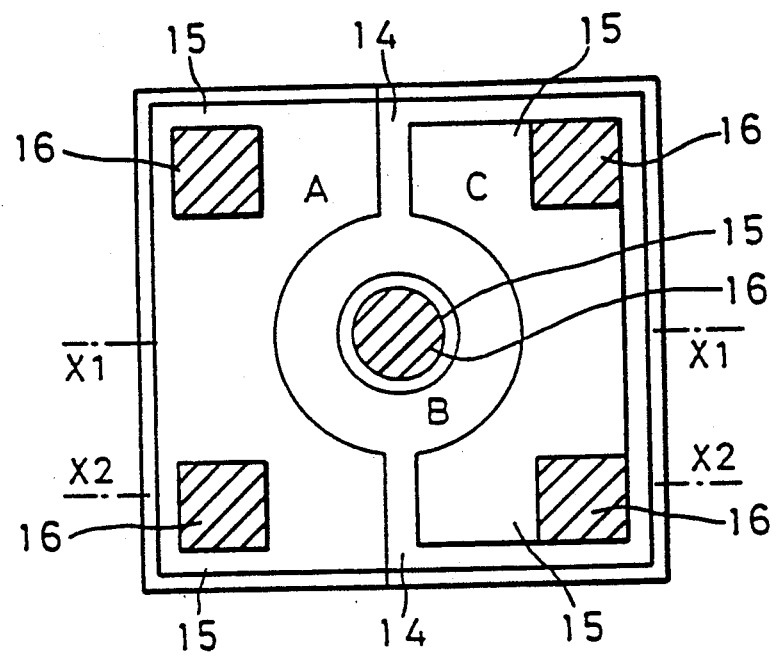
FIG. 15 is a plan view showing an essential part of the third embodiment employing another structure.
Figure 16:
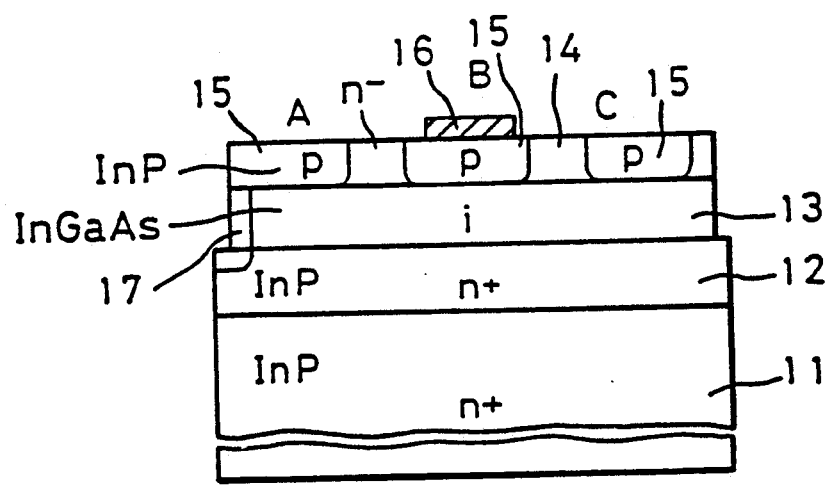
FIG. 16 is a cross sectional view showing the third embodiment along a line X1—X1 in FIG. 15.
Figure 17:
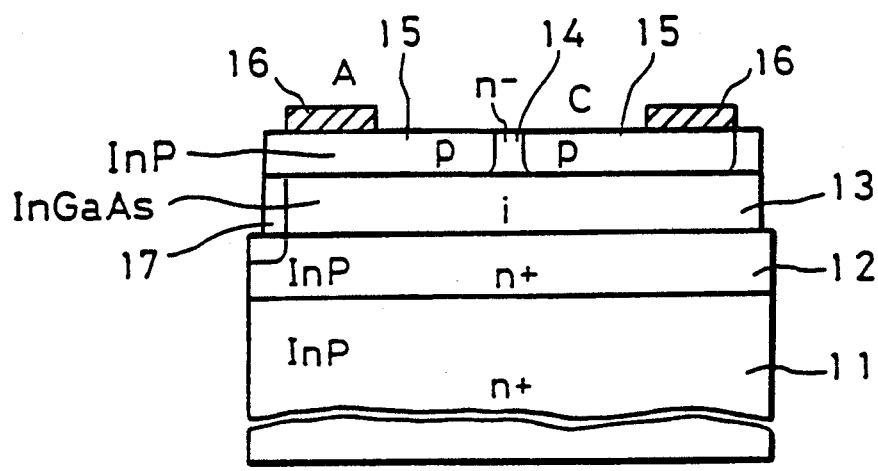
FIG. 17 is a cross sectional view showing the third embodiment along a line X2—X2 in FIG. 15.

A description will now be given of an alternative particular structure of the third embodiment, by referring to FIGS. 5 through 17. FIG. 15 shows a plan view of an essential part of the third embodiment. FIGS. 16 and 17 respectively are ross sectional views taken along lines X1—X1 and X2—X2 in FIG. 15. In FIGS. 15 through 17, those parts which are the same as those corresponding parts in FIGS. 9 through 11 are designated by the same reference numerals, and a description thereof will be omitted.

In this embodiment, the n−-type InP window layer 14 and the InGaAs photoabsorption layer 12 have a mesa structure, unlike the embodiment shown in FIGS. 9 through 11. In addition, the p-type window region 15 of the pin photodiode part A reaches the n+-type InP layer 12 via a p-type impurity diffusion region 17.

In FIGS. 15 through 17, an n-type semiconductor may be used for the window region 15 of the pin photodiode part A. But in this case, it is preferable to connect the n-type window region 15 and the n+-type InP layer 12 by forming an AuGe/Au layer/on the side surface of the mesa structure.

Figure 18:
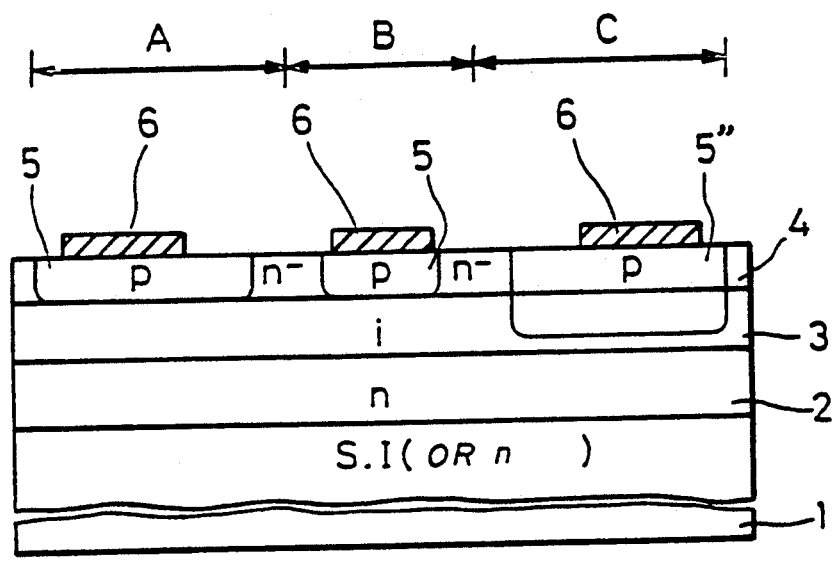
FIG. 18 is a cross sectional view for explaining a fourth embodiment of the semiconductor device according to the present invention and the operating principle thereof.
Figure 19:
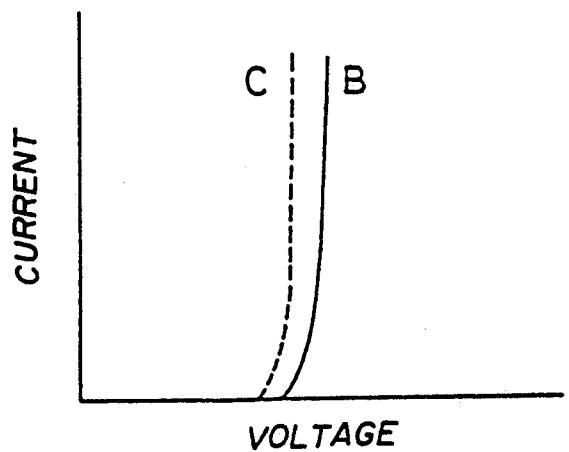
FIG. 19 shows withstand voltages of pin photodiode parts shown in FIG. 18 in the reverse direction.

Next, a description will be given of an operating principle of a fourth embodiment of the semiconductor device according to the present invention, by referring to FIGS. 18 and 19. FIG. 18 shows a cross section of an essential part of the semiconductor device, and FIG. 19 shows withstand voltages of the pin photodiode parts B and C in the reverse direction. In FIG. 18, those parts which are the same as those corresponding parts in FIGS. 7, 8, 12 and 13 are designated by the same reference numerals, and a description thereof will be omitted.

In this embodiment, the pin photodiode part C includes a p-type window region 5". The depth of this p-type window region 5" is greater than the corresponding p-type window region 5 of the pin photodiode part C of the first embodiment shown in FIGS. 9 through 11. In other words, the p-type window region 5" of the pin photodiode part C which functions as a bypass capacitor is deeper than the p-type window regions 5 of the pin photodiode parts A and B.

FIG. 19 shows the withstand voltages of the pin photodiode parts B and C shown in FIG. 18 in the reverse direction. In FIG. 19, the ordinate indicates the current and the abscissa indicates the voltage. As may be seen from FIG. 19, the withstand voltage in the reverse direction at the pin junction of the pin photodiode part C which functions as the bypass capacitor is lower than the withstand voltage in the reverse direction at the pin junction of the pin photodiode part B which functions as a pin photodiode. Hence, the effect of protecting the pin photodiode part B from the surge voltage or the like is improved in this embodiment. The withstand voltage in the reverse direction drops in the pin photodiode part C because the interface of the p-type window region 5" exists within the undoped InGaAs photoabsorption layer 3 which has a narrow energy band gap. On the other hand, the withstand voltage is high in the pin photodiode part B because the interface of the p-type window region 5 exists at the interface between the n−-type window layer 14 and the undoped InGaAs photoabsorption layer 13.

Figure 20:
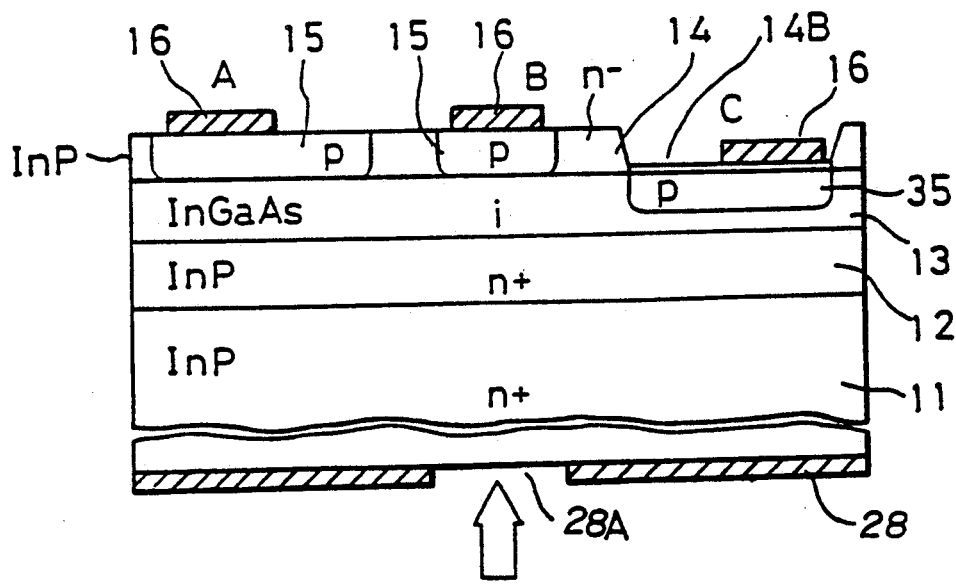
FIG. 20 is a cross sectional view showing an essential part of the fourth embodiment.

Next, a description will be given of a particular structure of the fourth embodiment, by referring to FIG. 20. In FIG. 20, those parts which are the same as those corresponding parts in FIGS. 9 through 17 are designated by the same reference numerals, and a description thereof will be omitted. For example, FIG. 20 corresponds to a cross section of the structure shown in FIG. 9 taken along a diagonal direction. Hence, all of the electrodes 16 are shown in FIG. 20 for the pin photodiode parts A, B and C.

In FIG. 20, a depression 14B is formed in the n−-type InP window layer 14, and an n side electrode 28 is provided on the substrate 11. An opening 28A is formed in the n side electrode 28 for receiving the incoming light.

The depression 14B is formed by etching the surface of the n⁻-type InP window layer 14. A deep p-type window region 35 is formed by an impurity diffusion which is carried out to form the p-type window regions 15 of the pin photodiode parts A and B. Hence, the p-type window regions 15 and 35 are formed simultaneously, although the p-type window region 35 is deeper than the p-type regions 15. In FIG. 20, the incident light is received via the opening 28A in the n side electrode 28 which is provided on the back or bottom surface of the substrate 11. However, it is of course possible to receive the incident light from the top surface of the structure. It is similarly possible to receive the incident light from the top surface of the structure in each of the embodiments described above.

In each of the embodiments shown in FIGS. 9 through 11, 14 through 17 and 20, the size of the rectangular chip is 200 $\mu m \times 200$ $\mu m$. In addition, the diameter of the p-type window region 15 of the pin photodiode part B is 15 to 20 $\mu m$. When operating the semiconductor device in each of the described embodiment, the connections are made as shown in the equivalent circuit of FIG. 8 or 13.

Next, a description will be given of an embodiment of a method of producing the semiconductor device according to the present invention. For the sake of convenience, it is assumed that the embodiment shown in FIGS. 9 through 11 is produced.

First, the n⁺-type InP layer 12, the undoped InGaAs photoabsorption layer 13 and the n⁻-type InP window layer 14 are successively formed on the n⁺-type InP substrate by using metal organic vapor phase epitaxy (MOVPE) techniques.

Second, a mask layer made of $SiO_2$, SiN or the like is formed on the entire top surface of the structure by a thermal chemical vapor deposition (CVD), a plasma CVD or the like.

Third, openings for implanting impurities are formed in the mask layer by an etching process using a photolithography technique.

Fourth, the p-type window regions 15 are formed by implanting Zn via the openings in the mask layer using a thermal diffusion technique. For example, this thermal diffusion is carried out at a temperature of 500° C. for approximately 30 minutes.

Fifth, the electrodes 16 are then formed using the resist process, vacuum deposition process and lift-off process of the photolithography technique. In other words, the mask layer is removed and the electrodes 16 are formed thereafter.

Of course, when forming the depression 14A or 14B, the depression 14A or 14B can be formed in the n⁻-type InP layer 14 prior to forming the mask layer.

According to the second through fourth embodiments, the p side electrode of the pin photodiode part B which originally functions as the pin photodiode is connected to a load resistor R for converting the photocurrent into the voltage. Hence, compared to the pin photodiode part C, the reverse bias voltage of the pin photodiode part B is constantly maintained to a small value. As a result, even when the surge voltage is applied to the pin photodiode parts B and C, via the power source line, the reverse current flow quickly to the pin photodiode part C to prevent breakdown of the pin photodiode part B. In addition, even when the surge voltage in the pulse form is applied to the pin photodiode parts B and C, the pulse surge voltage is sufficiently absorbed by the large junction capacitance of the pin photodiode part C to prevent breakdown of the pin photodiode part B.

Next, a description will be given of a fifth embodiment of the semiconductor device according to the present invention, by referring to FIGS. 21A and 21B.

Figure 21A:
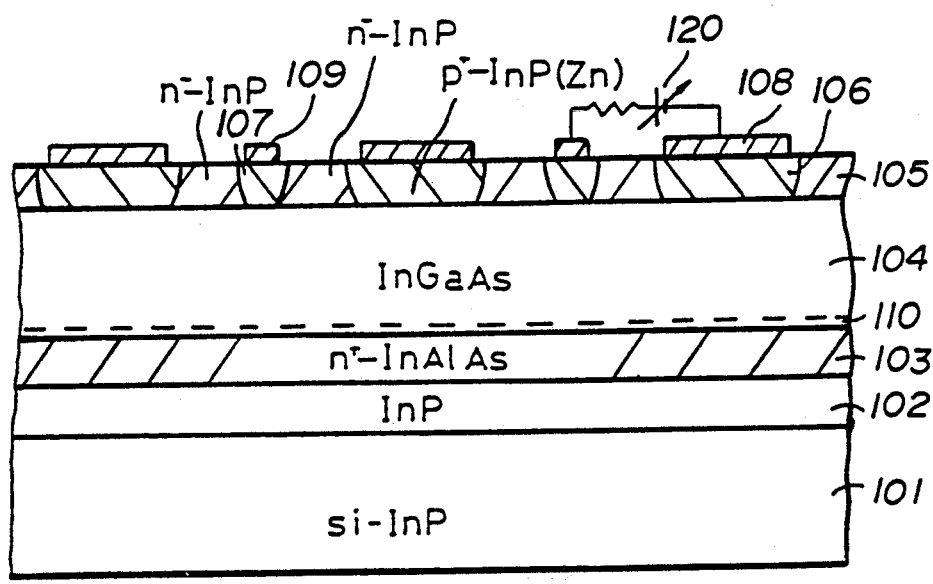
FIG. 21A is a cross sectional view showing an essential part of a fifth embodiment of the semiconductor device according to the present invention.

In FIG. 21A, a semiinsulative InP substrate 101 is doped with Fe, and an undoped InP layer 102 is formed on the semiinsulative InP substrate 101 as a buffer layer. An n⁺-type InAlAs layer 103 having a wide band gap and a high impurity concentration is formed on the undoped InP layer 102 as a carrier supply layer. For example, the n⁺-type InAlAs layer 103 has a thickness of approximately 1000 Å and is doped with Si so that the impurity concentration is approximately $1 \times 10^{18}$ cm⁻³. An undoped InGaAs photoabsorption layer 104 having a relatively narrow band gap is formed on the n⁺-type InAlAs layer 103. For example, the undoped InGaAs photoabsorption layer 104 has a thickness of approximately 1.7 $\mu m$. The undoped InGaAs photoabsorption layer 104 has a narrower band gap compared to that of the n⁺-type InAlAs layer 103 and receives the carriers (electrons) from the n⁺-type InAlAs layer 103. For this reason, a two-dimensional carrier (electron) gas layer 110 is formed in the vicinity of an interface between the undoped InGaAs photoabsorption layer 104 and the n⁺-type InAlAs layer 103.

An n⁻-type InP window layer 105 having a wide band gap is formed on the undoped InGaAs photoabsorption layer 104. For example, the n⁻-type InP window layer 105 has a thickness of approximately 0.3 $\mu m$ and is doped with Si so that the impurity concentration is approximately $1 \times 10^{16}$ cm⁻³. Zn is selectively diffused into the n⁻-type InP window layer 105 to form p⁺-type InP regions 106 and 107. The p⁺-type InP region 106 is wider (or larger in area) than the p⁺-type InP region 107. Ohmic electrodes made up of a AuZn-/Au structure is formed on each of the p⁺-type InP regions 106 and 107. A wide electrode 108 is formed on the wide p⁺-type InP region 106, and a narrow electrode 109 is formed on the narrow p⁺-type InP region 107. A reverse bias voltage (negative voltage) from a bias source 120 is applied to the wide electrode 108, while a forward bias voltage (positive voltage) from the bias source 120 is applied to the narrow electrode 109.

Figure 21B:
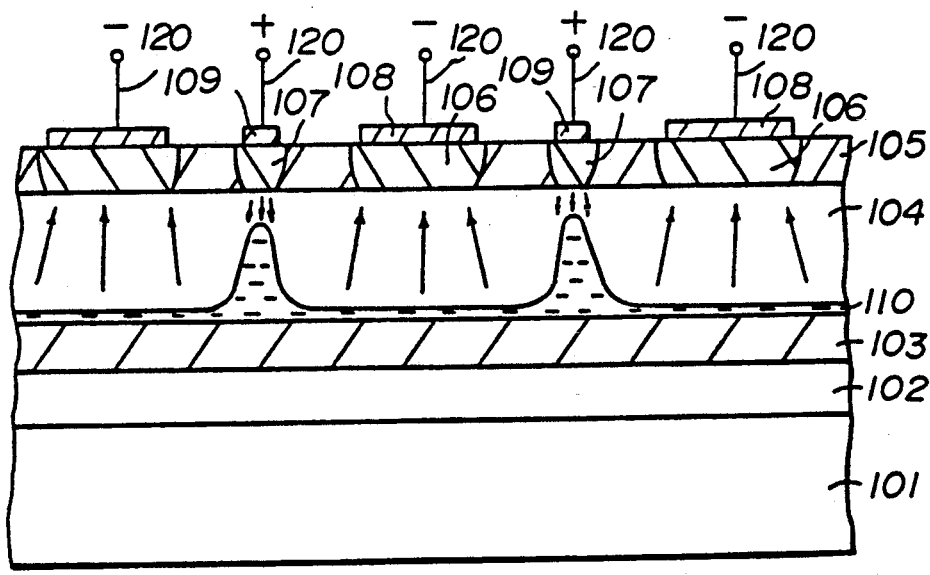
FIG. 21B is a cross sectional view for explaining the operation of the fifth embodiment.

FIG. 21B shows the operating mechanism of the fifth embodiment shown in FIG. 21A. A wide depletion layer is formed by the reverse bias under the wide electrode 108 which is applied with the negative voltage, that is, under the p⁺-type InP region 106. For this reason, the two-dimensional carrier gas layer 110 is pushed towards the boundary between the undoped InGaAs photoabsorption layer 104 and the n⁺-type InAlAs layer 103.

On the other hand, no depletion layer develops by the forward bias under the narrow electrode 109 to which is applied the positive voltage, that is, under the p⁺-type InP region 107. Hence, the two-dimensional carrier gas layer 110 which has opposite polarity is attracted towards the narrow electrode 109. As a result, the two-dimensional carrier gas layer 110 moves closer towards the p⁺-type InP region 107 under the narrow electrode 109 as shown in FIG. 21B.

Therefore, a wide depletion layer with an approximately vertical interface is formed under the wide electrode 108 which is reverse biased. Thus, when the electron-hole pairs are generated upon receipt of the incident light, these carriers are moved at a high speed due to the electric field. On the other hand, the two-dimensional carrier gas layer 110 is attracted towards the p+-type InP region 107 under the narrow electrode 109 which is forward biased. For this reason, the electrode 109 and the two-dimensional carrier gas layer 110 are connected via a low resistance, and the two-dimensional carrier gas layer 110 acts as an intermediate electrode.

According to this embodiment, the electric field develops vertically in a wide region within the undoped InGaAs photoabsorption layer 104, thereby forming a high-speed response region. In addition, since the two-dimensional carrier gas layer 110 is satisfactorily conductive, it is possible to eliminate a region in which the carrier transport is slow when the light is absorbed. As a result, the response speed of the photodiode becomes high.

In FIGS. 21A and 21B, the positive and negative electrodes 108 and 109 are connected to the p+-type InP regions 106 and 107 using an ohmic contact.

Figure 22A:
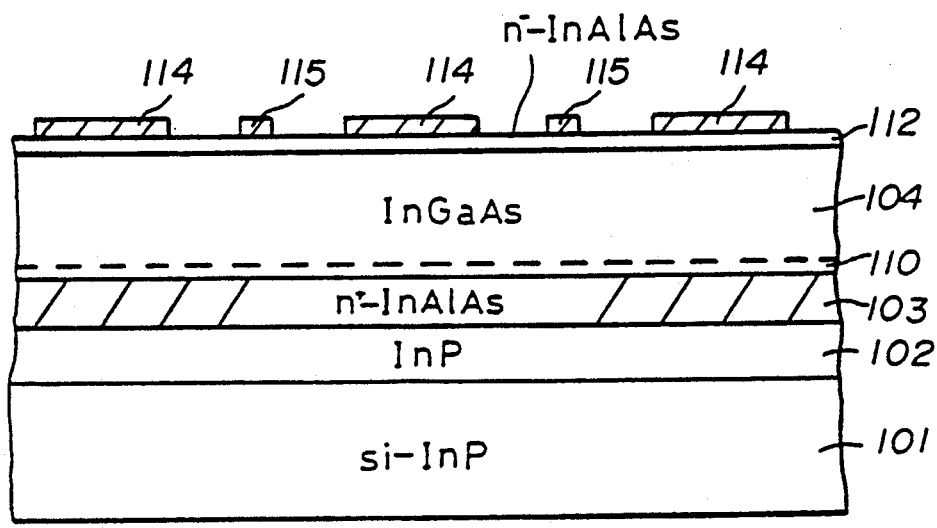
FIG. 22A is a cross sectional view showing the essential part of a sixth embodiment of the semiconductor device according to the present invention.
Figure 22B:
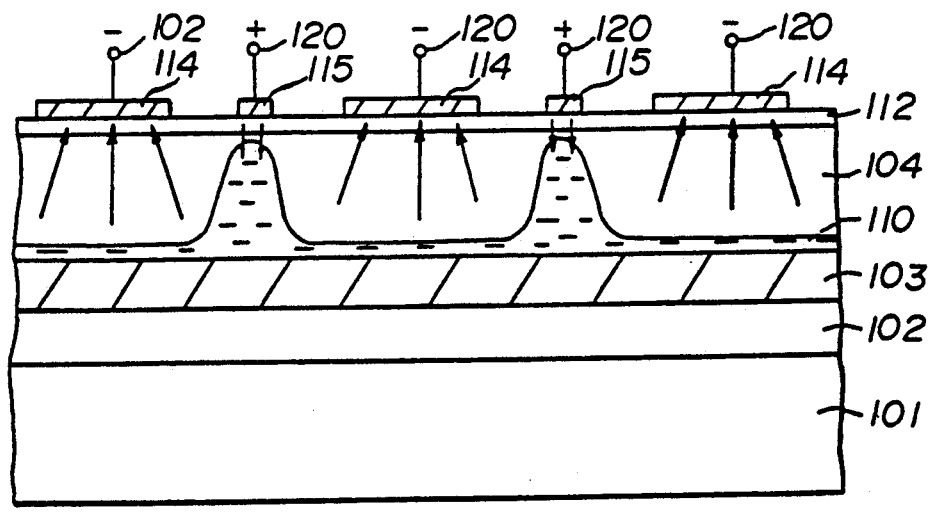
FIG. 22B is a cross sectional view for explaining an operation of the sixth embodiment.

Next, a description will be given of a sixth embodiment of the semiconductor device according to the present invention, by referring to FIGS. 22A and 22B. In this embodiment, the concept of the fifth embodiment is applied to the MSM photodiode which employs the Schottky contact. In FIGS. 22A and 22B, those parts which are the same as those corresponding parts in FIGS. 21A and 21B are designated by the same reference numerals, and a description thereof will be omitted.

In FIG. 22A, an n⁻-type InAlAs Schottky contact layer 112 for forming a Schottky contact is formed on the undoped InGaAs photoabsorption layer 104. For example, the n⁻-type InAlAs Schottky contact layer 112 has a thickness of approximately 200 Å. A wide Schottky contact electrode 114 having a large area and a narrow Schottky contact electrode 115 having a small area are respectively made of Al and are formed on the n⁻-type InAlAs Schottky contact layer 112. For example, the n+-type InAlAs layer (carrier supply layer) 103 has a thickness of approximately 1000 Å and is doped with Si so that the impurity concentration is approximately $1 \times 10^{18}$ cm$^{-3}$. In addition, the undoped InGaAs photoabsorption layer 104 has a thickness of approximately 1.7 μm, and the n⁻-type InAlAs Schottky contact layer 112 has a thickness of approximately 200 Å.

According to this embodiment, the carriers are supplied from the n+-type InAlAs layer (carrier supply layer) 103 to the undoped InGaAs photoabsorption layer 104, similarly as in the case of the fifth embodiment, and the two-dimensional carrier gas layer 110 is formed in the vicinity of the interface between the n+-type InAlAs layer 103 and the undoped InGaAs photoabsorption layer 104. In other words, the two-dimensional carrier gas layer 110 has a low resistance, and confronts the Schottky electrode 114 and 115 via the undoped InGaAs photoabsorption layer 104.

FIG. 22B shows the operating mechanism of the sixth embodiment shown in FIG. 22A. A negative voltage for reverse biasing is applied to the wide Schottky electrode 114, and a positive voltage for forward biasing is applied to the narrow Schottky electrode 115. For this reason, under the Schottky electrode 115, the two-dimensional carrier gas layer 110 is pulled upwardly by the positive voltage applied to the Schottky electrode 115 and is distributed close to the Schottky electrode 115. On the other hand, under the Schottky electrode 114, the two-dimensional carrier gas layer 110 is pushed downwardly by the negative voltage applied to the Schottky electrode 114, towards the boundary between the undoped InGaAs photoabsorption layer 104 and the n+-type InAlAs layer 103, thereby forming a wide depletion layer. Hence, the undoped InGaAs photoabsorption layer 104 is occupied by the depletion layer and the low resistance region. Therefore, when the incident light is absorbed by the undoped InGaAs photoabsorption layer 104 and the electron-hole pairs are generated, these carriers are quickly drawn towards the Schottky electrode 114 and 115.

In the fifth and sixth embodiment, the carrier supply layer 103 is made of InAlAs. However, any material such as InP which has a wide band gap and forms a lattice matching with the photoabsorption layer 104 may be used for the carrier supply layer 103.

Next, a description will be given of the electrical characteristics of the photodiodes in the fifth and sixth embodiment, by referring to FIGS. 23A through 23C.

Figure 23A:
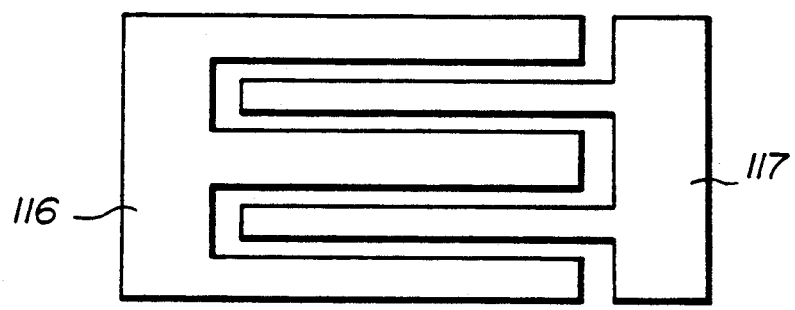
FIGS. 23A and 23B are plan views respectively showing electrode patterns which may be used in the fifth and sixth embodiments.

FIG. 23A shows a plan view of a pattern of the electrodes 108 and 109 or the electrodes 114 and 115 when the interdigital type electrodes are used. In FIG. 23A, a comb shaped electrode 116 having a relatively large area and a comb shaped electrode 117 having a relatively small area confront each other in an intermeshing manner to form the interdigital type electrodes. When a reverse bias voltage is applied to the electrode 116 and a forward bias voltage is applied to the electrode 117, a wide depletion layer is formed under the electrode 116 and a light sensitive region is generated.

Figure 23B:
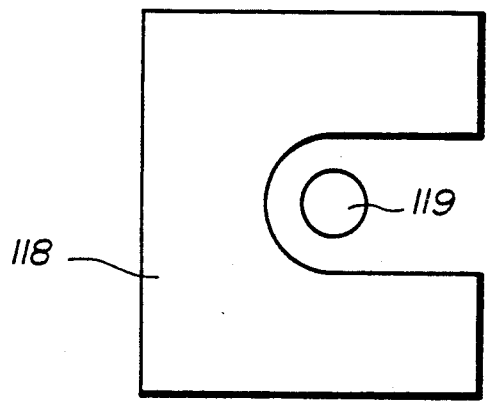

FIG. 23B shows a plan view of a pattern of the electrodes 108 and 109 or the electrodes 114 and 115 when a peripheral electrode surrounds a center electrode. In FIG. 23B, an electrode 118 having a relatively large area surrounds an electrode 119 having a relatively small area. In this case, the part of the electrode 119 becomes the light receiving region. Hence, a forward bias voltage is applied to the electrode 118 and a reverse bias voltage is applied to the electrode 119. On the other hand, when a reverse bias voltage is applied to the electrode 118 and a forward bias voltage is applied to the electrode 119, a part of the electrode 118 becomes the light receiving region. The light receiving region changes similarly for the interdigital type electrodes shown in FIG. 23A.

Figure 23C:
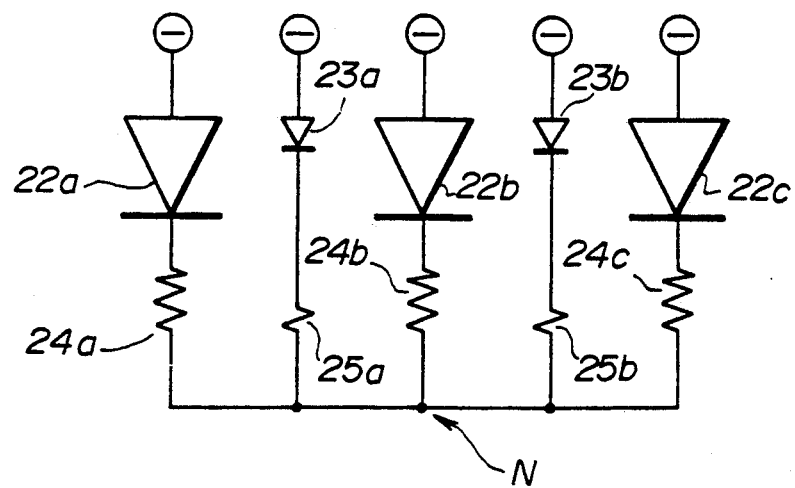
FIG. 23C is a circuit diagram showing an equivalent circuit of photodiodes having electrodes with different areas.

FIG. 23C shows an equivalent circuit of photodiodes which use electrodes having different areas. FIG. 23C shows the equivalent circuit for the case shown in FIG. 23A where there are three electrodes having the relatively large area and two electrodes having the relatively small area.

Diodes 122a, 122b and 122c having the relatively large areas and diodes 123a and 123b having the relatively small areas are coupled in parallel as shown in FIG. 23C. The diodes 122a, 122b, 122c, 123a and 123b respectively have internal resistances 124a, 124b, 124c, 125a and 125b. In each of the diodes 123a and 123b which are applied with a forward bias voltage, the two-dimensional carrier gas layer is drawn towards the electrode and the internal resistances 125a and 125b thereof are small. On the other hand, the two-dimensional carrier gas layer is pushed away from the electrode when a reverse bias voltage is applied to each of the diodes 122a, 122b and 122c, and the internal resistances 124a, 124b and 124c thereof are large.

Accordingly, the diodes 123a to and 123b which are applied with the forward bias voltage and the resistances 125a and 125b substantially act as electrodes connected to a common node N. Hence, the diodes 122a, 122b and 122c operate similarly to the conventional pin photodiodes.

In the fifth and sixth embodiments described above, the positive and negative electrodes can be formed on the same surface of the structure by the same process. For this reason, the production process is simplified and the integration of the elements is facilitated. In addition, the high-speed operation of the photodiode is realized because the photodiode can be operated without forming a region with the slow response within the photoabsorption layer, that is, a region in which the resistivity is large and the electric field is small.

In the fifth and sixth embodiments, only a material having a wider band gap exists on both sides of the photoabsorption layer 104. Consequently, the incident light may be received from the top or bottom surface of the structure.

Figure 24A:
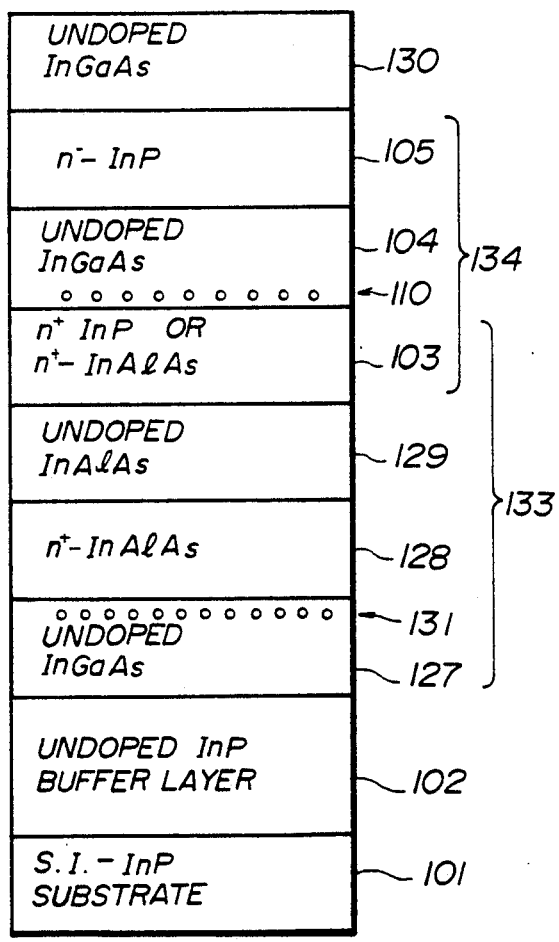
FIGS. 24A and 24B respectively show substrate structure suited for forming an optical electronic integrated circuit device.
Figure 24B:
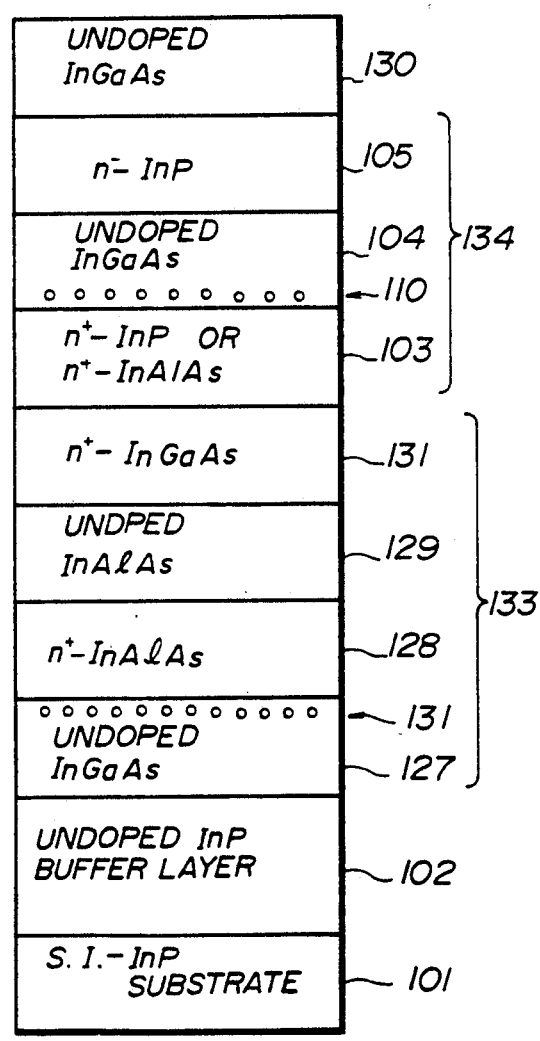

Next, a description will be given of a semiconductor device in which the photodiodes shown in FIGS. 21A or 21B are integrated. FIGS. 24A and 24B respectively show a substrate structure which is suited for forming an optoelectronic integrated circuit device.

In FIG. 24A, an undoped InP buffer layer 102 is formed on a semiinsulative InP substrate 101. A stacked structure 133 for forming an electronic element such as a high electron mobility transistor (HEMT) element is formed on the undoped InP buffer layer 102. A stacked structure 134 capable of forming a photodiode by using a part of the stacked structure 133 in common is formed on the stacked structure 133. An undoped InGaAs protecting cover layer 130 is formed on the stacked structure 134.

When forming the HEMT element, the stacked structure 133 includes an undoped InGaAs layer 127 which becomes a channel layer, an n+-type InAlAs layer 128 which becomes an electron supply layer, an undoped InAlAs layer 129, and an n+-type InP layer 103 which becomes an electrode layer. The undoped InAlAs layer 129 may be omitted. In addition, the layer 103 may be made of n+-type InAlAs.

The stacked structure 134 includes an n+-type InP layer 103 which becomes an electron supply layer in the photodiode, an undoped InGaAs layer 104 which becomes a photoabsorption layer, and an n--type InP layer 105. The layer 103 may be made of n+-type InAlAs.

A two-dimensional electron gas layer 131 is formed in the undoped InGaAs layer 127 of the stacked structure 133 in a vicinity of an interface between the n+-type InAlAs layer 128 and the undoped InGaAs layer 127. In addition, a two-dimensional electron gas layer 110 is formed in the undoped InGaAs layer 104 of the stacked structure 134 in the vicinity of an interface between the n+-type InP layer 103 and the undoped InGaAs layer 104.

In FIG. 24B, those parts which are the same as those corresponding parts in FIG. 24A are designated by the same reference numerals, and a description thereof will be omitted. In FIG. 24B, an n+-type InGaAs layer 131 and an n+-type InP layer 103 are used in place of the n+-type InP layer 103 of the substrate structure shown in FIG. 24A. As a result, the stacked structures 133 and 134 do not have a common part.

In the substrate structures shown in FIGS. 24A and 24B, it is possible to form the photodiode structure shown in FIG. 21A by removing the undoped InGaAs protecting cover layer 130 at the surface and diffusing Zn into the n--type InP layer 105 to form the p-type window regions. In addition, it is possible to use in place of the n--type InP layer 105 an InAlGaAs layer in which the composition gradually changes. For example, it is possible to use an InAlGaAs layer having a thickness of approximately 200 Å, change the composition from the photoabsorption layer InGaAs to InAlAs, and use an InAlAs layer having a thickness of approximately 300 Å as the protecting cover layer 130.

The InGaAs layer which forms the photoabsorption layer may be selectively etched using the InP layer as an etching stopper. For example, it is possible to selectively etch the InGaAs layer by use of an etchant in which $H_2O_2:H_2SO_4:H_2O = 5:1:1$.

For example, in the substrate structure shown in FIG. 24A, the undoped InGaAs layer 127 is a channel layer for transporting the two-dimensional electron gas and has a thickness of approximately 200 to 1000 Å. The n+-type InAlAs layer 128 is an electron supply layer having an impurity concentration of approximately $1 \times 10^{18}$ to $1 \times 10^{19}$ cm$^{-3}$ and a thickness of approximately 200 to 1000 Å. The n+-type InP layer 103 has an impurity concentration of approximately $1 \times 10^{17}$ to $1 \times 10^{19}$ cm$^{-3}$ and a thickness of approximately 0.05 to 0.5 μm. The undoped InGaAs layer 104 is a photoabsorption layer having a thickness of approximately 1 to 2 μm. The n--type InP layer 105 has an impurity concentration of approximately $1 \times 10^{16}$ cm$^{-3}$ and a thickness of approximately 0.1 to 0.5 μm. These layers are successively formed on the semiinsulative InP substrate 101 via the undoped InP buffer layer 102 by epitaxial growth.

Figure 25:
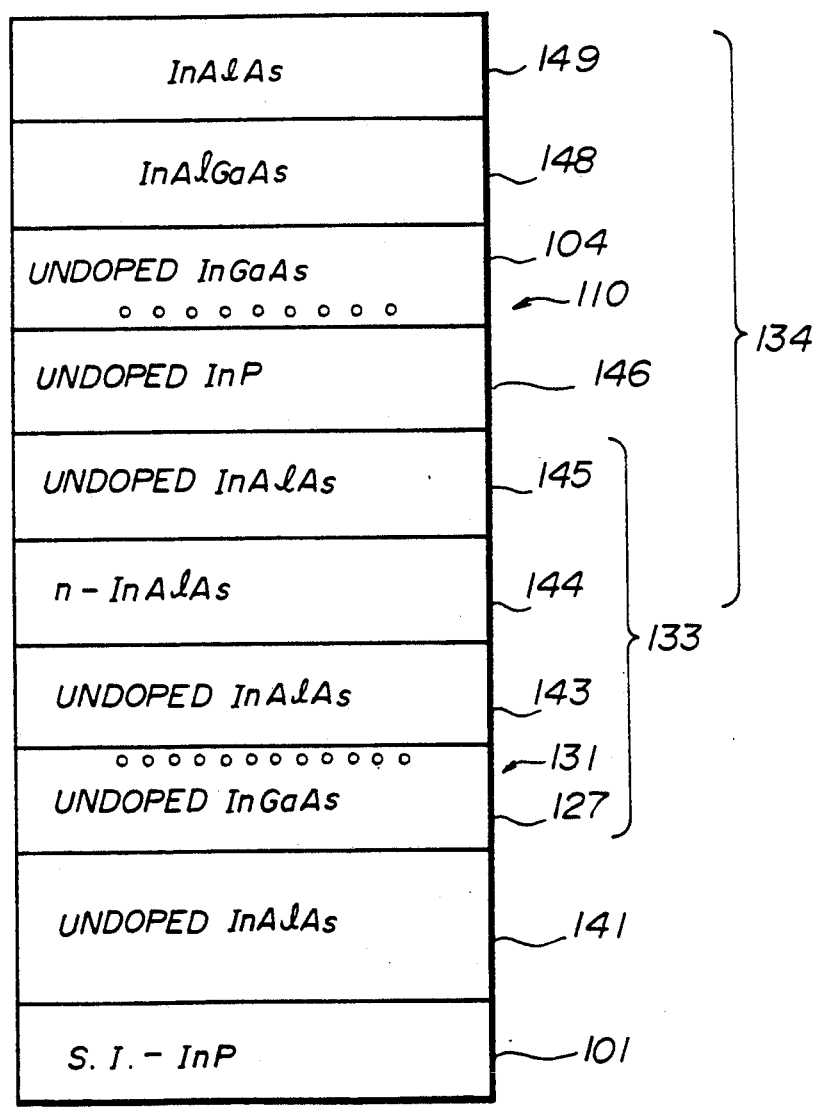
FIG. 25 shows another substrate structures suited for forming an optical electronic integrated circuit device.

FIG. 25 shows another substrate structure which is suited for forming an optoelectronic integrated circuit device. In FIG. 25, an undoped InAlAs layer 141 is formed on the semiinsulative InP substrate 101 as a buffer layer. An undoped InGaAs layer 127 which becomes a channel layer is formed on the undoped InAlAs layer 141. An n-type InAlAs layer 144 which becomes an electron supply layer is formed on the undoped InGaAs layer 127 via an undoped InAlAs layer 143 which becomes a spacer layer. In addition, an undoped InAlAs layer 145 for forming a Schottky gate is formed on the n-type InAlAs layer 144. The layers 127, 143, 144 and 145 form a stacked structure 133 for forming the HEMT element.

An undoped InP layer 146 which functions as an etching stopper and has a thickness of approximately 1000 Å, for example, is formed on the undoped InAlAs layer 145. An undoped InGaAs layer 104 which becomes a photoabsorption layer and has a thickness of approximately 1.5 μm, for example, is formed on the undoped InP layer 146. An InAlGaAs layer 148 in which the composition gradually changes and which has a thickness of approximately 200 Å, for example, is formed on the undoped InGaAs layer 104. In addition, an InAlAs layer 149 which becomes a barrier layer and has a thickness of approximately 300 Å, for example, is formed on the InAlGaAs layer 148. A Schottky electrode made of Al or the like is formed on the InAlAs layer 149. The layers 144, 145, 146, 104, 148 and 149 form a stacked structure for forming an MSM photodiode.

The etching characteristics of the undoped InGaAs and the undoped InP differ. Hence, it is possible to selectively etch only the InGaAs layer 104 using the InP layer 146 as an etching stopper and an etchant composition of $H_2O_2:H_2SO_4:H_2O = 5:1:1$, for example.

Next, a description will be given of the seventh embodiment of the semiconductor device according to the present invention, by referring to FIG. 26A. In this embodiment, the present invention is applied to the optoelectronic integrated circuit device employing the substrate structure shown in FIG. 24A, 24B or 25.

Figure 26A:
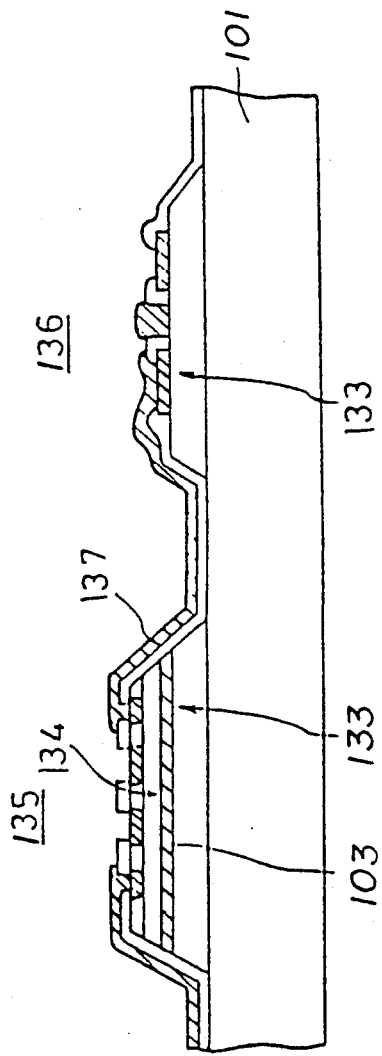
FIG. 26A is a cross sectional view showing an essential part of a seventh embodiment of the semiconductor device according to the present invention.

In FIG. 26A, a light receiving element 135 is formed on the left side of the device using the stacked structure 134, and an electronic element 136 is formed on the right side of the device using the stacked structure 133. The light receiving element 135 and the electronic element 136 are connected via an interconnection metal layer 137. The stacked structure 133 under the light receiving element 135 on the left side of the device merely functions as an underlayer structure for physically supporting the light receiving element 135. On the other hand, the stacked structure 134 above the stacked structure 133 on the right side of the device is removed by an etching process.

Figure 26B:
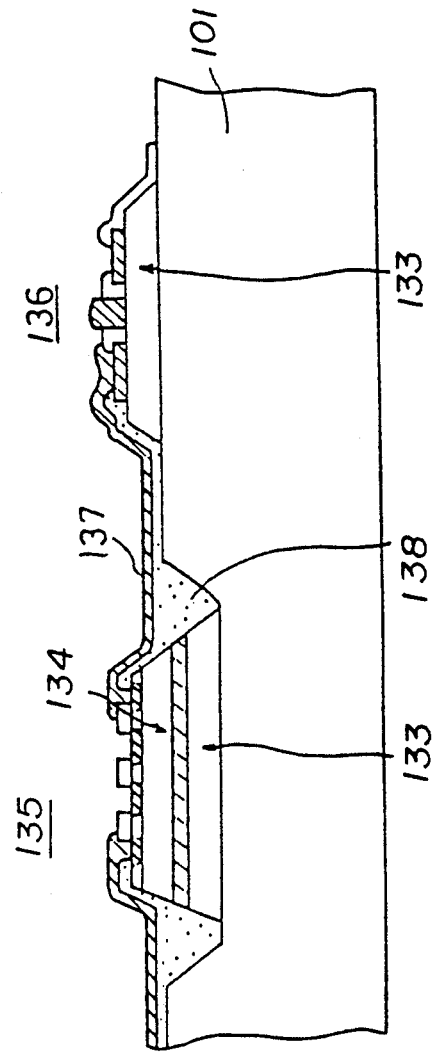
FIG. 26B is a cross sectional view showing a modification of the seventh embodiment.

FIG. 26B shows a modification of the seventh embodiment, in which the top surface of the device is planarized. A region on the left side of the device where the photodiode 135 is formed is formed as a depression by selectively etching the substrate 101. For this reason, the top surface of the structure made up of the epitaxially grown stacked structure 133 and the stacked structure 134 on the left side of the device become approximately the same level as the substrate surface in the vicinity thereof. On the other hand, an electronic element 136 similar to that shown in FIG. 26A is formed on the right side of the device. In addition, a filling material such as polyimide fills the part of the depression surrounding the light receiving element 135 which includes the photodiode, so as to realize a substantially flat surface at the top of the device. Of course, when the electronic element 136 and the light receiving element 135 are arranged close to each other, it is possible to make the depression of the substrate 101 more shallow compared to that shown in FIG. 26B so that the top surfaces of the elements 136 and 135 become substantially the same.

Therefore, it is possible to form an optoelectronic integrated circuit device having a planar structure using the stacked structure used for forming the HEMT element and the stacked structure used for forming the electronic element.

According to the embodiments described above, the electrodes are made of the same electrode material and are arranged substantially on the same plane. In other words, there is no need to use two different electrode materials to form the n side and p side electrodes. As a result, the electrodes can be formed by use of a single mask using the same electrode material, and there is no need to align two different masks with a high accuracy. Therefore, the device production process is simplified and the high performance of the device is guaranteed.

Further, the present invention is not limited to these embodiments, but various variations and modifications may be made without departing from the scope of the present invention.

What is claimed is:

1. A semiconductor device comprising:
a substrate;
a first layer formed on the substrate and made of a semiconductor of a first conductive type;
a second layer formed on the first layer and functioning as a photoabsorption layer;
a third layer formed on the second layer and made of a semiconductor of the first conductive type;
a plurality of regions formed in the third layer and made of a semiconductor of a second conductive type opposite to the first conductive type thereby forming a plurality of pin diodes, each of said regions at least reaching the second layer; and
a plurality of electrodes respectively formed on the plurality of regions and made of the same electrode material,
a first electrode of the plurality of electrodes receiving a positive voltage to forward bias a first pin diode of the plurality of pin diodes, and
a second electrode of the plurality of electrodes receiving a negative voltage to reverse bias a second pin diode of the plurality of pin diodes so that the second pin diode operates as a pin photodiode.

2. The semiconductor device as claimed in claim 1, wherein the semiconductor of the first conductive type is an n-type semiconductor, and the semiconductor of the second conductive type is a p-type semiconductor.

3. The semiconductor device as claimed in claim 1, wherein the first electrode is connected to the region having a first area of contact with the third layer, and the second electrode is connected to the region having a second area of contact with the third layer, said second area being smaller than the first area.

4. The semiconductor device as claimed in claim 1, wherein said substrate is made of a material selected from a group consisting of a semiinsulative semiconductor and a semiconductor of the first conductive type.

5. The semiconductor device as claimed in claim 1, wherein said first layer is made of a material selected from the group consisting of InP and AlGaAs.

6. The semiconductor device as claimed in claim 1, wherein said second layer is made of a material selected from the group consisting of InGaAs and GaAs.

7. The semiconductor device as claimed in claim 1, wherein said third layer is made of a material selected from the group consisting of InP and AlGaAs.

8. The semiconductor device as claimed in claim 1, wherein the first and second pin diodes are arranged adjacent to each other.

9. The semiconductor device as claimed in claim 1, which further comprises an insulator layer which is formed on the third layer, said insulator layer having windows through which the electrodes connect to the regions.

10. The semiconductor device as claimed in claim 1, wherein said substrate includes a lens portion formed at a position corresponding to the position of the second electrode for converging an incoming light at a pin junction of said second pin diode.

11. The semiconductor device as claimed in claim 10, which further comprises a non-reflecting coating layer formed on the surface of the substrate on a side thereof opposite to the first layer for preventing reflection at the surface of the substrate.

12. The semiconductor device as claimed in claim 1, wherein the electrodes are formed on substantially the same plane.

13. The semiconductor device as claimed in claim 1, wherein the electrodes are arranged at predetermined positions to stably support the semiconductor device when flip-chip bonding the semiconductor device.

14. The semiconductor device as claimed in claim 1, wherein a third electrode out of the electrodes receives a negative voltage to reverse bias a third pin diode of the plurality of pin diodes, the first and third electrodes are connected to the regions having first and third areas of contact with the third layer and the second electrode is connected to the region having a second area, said second area being smaller than the first and third areas, and said third pin diode operating as a bypass capacitor for protecting the pin junction of said second pin diode.

15. The semiconductor device as claimed in claim 14, wherein the region connected to the first electrode reaches the first layer.

16. The semiconductor device as claimed in claim 14, wherein the withstand voltage of a pin junction of the third pin diode in a reverse direction is lower than the withstand voltage of the pin junction of the second pin diode in the reverse direction.

17. The semiconductor device as claimed in claim 14, wherein the region which connects to the third electrode extends into the second layer to a depth which is deeper than the region which connects to the second electrode, so that the withstand voltage of the pin junction of the third pin diode in a reverse direction is lower than the withstand voltage of the pin junction of the second pin diode in the reverse direction.

18. The semiconductor device as claimed in claim 14, which further comprises a depression formed in the third layer, the region which connects to the third electrode extending into the second layer from, the depression, so that the withstand voltage of the pin junction of the third pin diode in a reverse direction is lower than the withstand voltage of the pin junction of the second pin diode in the reverse direction, and said third electrode connecting to the region within the depression.

19. The semiconductor device as claimed in claim 14, which further comprises a depression formed in the third layer, the region which connects to the first electrode extending into the second layer from the depression and said first electrode connecting to the region within the depression.

20. The semiconductor device as claimed in claim 14, wherein the semiconductor of the first conductive type is an n-type semiconductor, and the semiconductor of the second conductive type is a p-type semiconductor.

21. A semiconductor device comprising:
a substrate;
s first layer formed on the substrate and made of a semiconductor;
a second layer formed on the first layer and made of a semiconductor of a first conductive type with a first band gap;
a third layer formed on the second layer and made of a material having a second band gap which is smaller than the first band gap, said third layer functioning as a photoabsorption layer;
a fourth layer formed on the third layer and made of a semiconductor of the first conductive type with an impurity concentration greater than that of the third layer;
a plurality of regions formed in the fourth layer and made of a semiconductor of a second conductive type opposite to the first conductive type thereby forming a plurality of pin diodes, each of said regions at least reaching the third layer; and
a plurality of electrodes respectively formed on the regions and made of the same electrode material,
a first electrode of the plurality of electrodes being connected to a first region of the plurality of regions and receiving a positive voltage to forward bias a first pin diode of the plurality of pin diodes, said first region having a first area of contact with the fourth layer,
a second electrode of the plurality of electrodes being connected to a second region of the plurality of electrodes being connected to a second region of the plurality of regions and receiving a negative voltage to reverse bias a second pin diode of the plurality of pin diodes, said second region having a second area of contact with said fourth layer and said second area being larger than the first area.

22. The semiconductor device as claimed in claim 21, wherein said third layer has a predetermined thickness and an impurity concentration which enables a depletion layer to extend for a large part of the thickness thereof, a two-dimensional carrier gas layer exists in the third layer in the vicinity of an interface between the second and third layers under the second region and exists in the third layer closer to the fourth layer under the first region.

23. The semiconductor device as claimed in claim 21, wherein the semiconductor of the first conductive type is an n-type semiconductor, and the semiconductor of the second conductive type is a p-type semiconductor.

24. The semiconductor device as claimed in claim 21, wherein said first layer is made of InP.

25. The semiconductor device as claimed in claim 24, wherein said second layer is made of a material selected from the group consisting of InAlAs and InP.

26. The semiconductor device as claimed in claim 25, wherein said third layer is made of InGaAs.

27. The semiconductor device as claimed in claim 26, wherein said fourth layer is made of InP.

28. The semiconductor device as claimed in claim 21, wherein the first and second pin diodes are arranged adjacent to each other.

29. The semiconductor device as claimed in claim 21, wherein the electrodes are formed on substantially the same plane.

30. A semiconductor device comprising:
a substrate;
a first layer formed on the substrate and made of a semiconductor;
a second layer formed on the first layer and made of a semiconductor of a first conductive type with a first band gap;
a third layer formed on the second layer and made of a material having a second band gap which is smaller than the first band gap, said third layer functioning as a photoabsorption layer;
a fourth layer formed on the third layer and made of a semiconductor of the first conductive type with an impurity concentration greater than that of the third layer; and
a plurality of Schottky electrodes respectively formed on the fourth layer in a corresponding plurality of regions and made of the same electrode material, thereby forming a plurality of metal-semiconductor-metal diodes,
a first electrode of the plurality of electrodes being connected to a first region of the plurality of regions of the fourth layer and receiving a positive voltage to forward bias a first metal-semiconductor-metal diode of the plurality of metal-semiconductor-metal diodes, said first region having a first area of contact with the fourth layer,
a second electrode of the plurality of electrodes being connected to a second region of the plurality of regions of the fourth layer and receiving a negative voltage to reverse bias a second metal-semiconductor-metal diode of the plurality of metal-semiconductor-metal diodes, said second region having a second area of contact with said fourth layer and said second area being larger than the first area.

31. The semiconductor device as claimed in claim 30, wherein said third layer has a predetermined thickness and an impurity concentration which enables a depletion layer to extend for a large part of the thickness thereof, and a two-dimensional carrier gas layer exists in the third layer in the vicinity of an interface between the second and third layers under the second region and exists in the third layer closer to the fourth layer under the first region.

32. The semiconductor device as claimed in claim 30, wherein the semiconductor of the first conductive type is an n-type semiconductor, and the semiconductor of the second conductive type is a p-type semiconductor.

33. The semiconductor device as claimed in claim 30, wherein said first layer is made of InP.

34. The semiconductor device as claimed in claim 33, wherein said second layer is made of a material selected from the group consisting of InAlAs and InP.

35. The semiconductor device as claimed in claim 34, wherein said third layer is made of InGaAs.

36. The semiconductor device as claimed in claim 35, wherein said fourth layer is made of InAlAs.

37. The semiconductor device as claimed in claim 30, wherein the first and second pin diodes are arranged adjacent to each other.

38. The semiconductor device as claimed in claim 30, wherein the electrodes are formed on substantially the same plane.

39. A semiconductor device comprising:
a semiinsulative substrate;
a first stacked structure formed on the semiinsulative substrate and including layers for forming an electronic element; and
a second stacked structure formed on the first stacked structure and including layers for forming an optoelectronic element,
said second stacked structure including:
 a first layer formed on the first stacked structure and made of a semiconductor of a first conductive type with a first band gap;
 a second layer formed on the first layer and made of a material having a second band gap which is smaller than the first band gap, said second layer functioning as a photoabsorption layer;
 a third layer formed on the second layer and made of a semiconductor of the first conductive type with an impurity concentration greater than that of the second layer;
 a plurality of regions formed in the third layer and made of a semiconductor of a second conductive type opposite to the first conductive type thereby forming a plurality of pin diodes, each of said regions at least reaching the second layer; and
 a plurality of electrodes respectively formed on the plurality of regions and made of the same electrode material,
 a first electrode of the plurality of electrodes being connected to a first region of the plurality of regions and receiving a positive voltage to forward bias a first pin diode of the plurality of pin diodes, said first region having a first area of contact with the third layer,
 a second electrode of the plurality of electrodes being connected to a second region of the plurality of regions and receiving a negative voltage to reverse bias a second pin diode of the plurality of pin diodes, said second region having a second area of contact with said third layer and said second area being larger than the first area.

40. The semiconductor device as claimed in claim 39, wherein a part of the second stacked structure is used in common as a part of the first stacked structure.

41. A semiconductor device comprising:
a semiinsulative substrate;
a first stacked structure formed on the semiinsulative substrate and including layers for forming an electronic element; and
a second stacked structure formed on the first stacked structure and including layers for forming an optoelectronic element,
said second stacked structure including:
 a first layer formed on the first stacked structure and made of a semiconductor of a first conductive type with a first band gap;
 a second layer formed on the first layer and made of a material having a second band gap which is smaller than the first band gap, said second layer functioning as a photoabsorption layer;
 a third layer formed on the second layer and made of a semiconductor of the first conductive type with an impurity concentration greater than that of the second layer; and
 a plurality of Schottky electrodes respectively formed on the third layer in a corresponding plurality of regions and made of the same electrode material thereby forming a plurality of metal-semiconductor-metal diodes,
 a first electrode of the plurality of electrodes being connected to a first region of the plurality of regions of the third layer and receiving a positive voltage to forward bias a first metal-semiconductor-metal diode of the plurality of metal-semiconductor-metal diodes, said first region having a first area of contact with the third layer,
 a second electrode of the plurality of electrodes being connected to a second region of the plurality of regions of the third layer and receiving a negative voltage to reverse bias a second metal-semiconductor-metal diode of the plurality of metal-semiconductor-metal diodes, said second region having a second area of contact with said third layer and said second area being larger than the first area.

42. The semiconductor device as claimed in claim 41, wherein a part of the second stacked structure is used in common as a part of the first stacked structure.

* * * * *

UNITED STATES PATENT AND TRADEMARK OFFICE
CERTIFICATE OF CORRECTION

PATENT NO. : 5,107,318

DATED : April 21, 1992

INVENTOR(S) : Masao MAKIUCHI et al.

It is certified that error appears in the above-identified patent and that said Letters Patent is hereby corrected as shown below:

Title PAGE:

item [54]   In the TITLE OF THE INVENTION ("[54]"), delete the phrase "WITH CAPACITANCE".

Delete the "[56] References Cited" section and replace with the following:

item [56]                      References Cited

U.S. PATENT DOCUMENTS

| | | | |
|---|---|---|---|
| 4,403,397 | 9/1983 | Bottka et al. | 437/5 |
| 4,451,691 | 5/1984 | Fraas | 437/5 |
| 4,634,883 | 1/1987 | Nishiura et al. | 250/578 |
| 4,637,126 | 1/1987 | Lightstone | 437/5 |
| 4,876,209 | 10/1989 | Forrest | 437/5 |
| 4,885,622 | 12/1989 | Nomoto et al. | 250/578 |
| 5,004,903 | 4/1991 | Kitamura et al. | 357/30 |
| 5,010,381 | 4/1991 | Shiba | 437/904 |
| 5,051,372 | 9/1991 | Sasaki | 437/3 | under item [56] FOREIGN PATENT DOCUMENTS

| | | | |
|---|---|---|---|
| 57-083069 | 5/1982 | Japan | 435/5 |
| 57-155786 | 9/1982 | Japan | 437/5 |
| 62-160775 | 7/1987 | Japan | 437/5 |
| 1-194352 | 8/1989 | Japan | 357/30 E |
| 1-259578 | 10/1989 | Japan | 357/30 E |
| 2 212 020 | 12/1989 | United Kingdom | |

UNITED STATES PATENT AND TRADEMARK OFFICE
CERTIFICATE OF CORRECTION

PATENT NO. : 5,107,318
DATED : April 21, 1992
INVENTOR(S) : Masao MAKIUCHI et al.

It is certified that error appears in the above-identified patent and that said Letters Patent is hereby corrected as shown below:

OTHER PUBLICATIONS

Ota et al., "Twelve-Channel Individually Addressable InGaAs/InP p-i-n Photodiode and InGaAs/InP LED Arrays in a Compact Package", *Journal of Lightwave Technology*, Vol. LT-5, No. 8, Aug. 1987, pp. 1118-1122.

Rosen et al., "Optically achieved p-i-n diode switch utilizing a two-dimensional laser array at 808 mm as an optical source", *IEEE Transactions on Electron Devices*, Vol. 36, No. 2, Feb. 1989, New York, NY, pp. 367-374.

Hamaguchi et al., "Twin-PIN photodiode with high-speed response at high optical input power for coherent receiver", *Japanese Journal of Applied Physics*, 21st Conference, Tokyo, Japan, Aug. 28-30, 1989, pp. 453-456.

Bauer et al., "InGaAs dual-pin detector with very symmetric properties for use in coherent optical receivers", *IEEE Electron Device Letters*, Vol. 10, No. 12, Dec. 1989, New York, NY, pp. 583-584.

Kaede et al., "12-Channel Parallel Optical-Fiber Transmission Using a Low-Drive Current 1.3 μm LED Array and a p-i-n PD Array", *Journal of Lightwave Technology*, Vol. 8, No. 6, Jun. 1990, pp. 883-888.

- Col. 1, line 35, change "small" to --smaller--;
  line 45, change "PF" to --Pf--;
- line 46, delete "by".

Col. 2, line 58, change "$1 \times 10^{-3}$" to --$1 \times 10^{16}$ cm$^{-3}$--.

Col. 4, line 25, delete "out";
  line 51, after "material" insert --,--;
- line 52, after "of the" insert --plurality of--;
- line 53, delete "out".

UNITED STATES PATENT AND TRADEMARK OFFICE
CERTIFICATE OF CORRECTION

PATENT NO.  : 5,107,318

DATED       : April 21, 1992

INVENTOR(S) : Masao MAKIUCHI et al.

It is certified that error appears in the above-identified patent and that said Letters Patent is hereby corrected as shown below:

Col. 5,  line 61, delete "out";

line 66, delete "out", and after "of the" insert --plurality of--.

Col. 6,  line 8,  change "where" to --wherein--;

line 13, change "where" to --wherein--;

line 23, delete "out";

line 24, after "the" (first occurrence) insert --plurality of--.

Col. 7,  line 51, change "an" to --the--;

line 60, change "structure" to --structures--;

line 62, change "structures" to --structure--.

Col. 10, line 2,  change "fourth" to --first--;

line 65, change "$1 \times 10^{18}$" to --$1 \times 10^{16}$--;

line 68, change "a" (first occurrence) to --an--.

Col. 11, line 16, change "5," to --5'--;

line 18, change "5," to --5'--' line 37, change "A," to --A'--;

line 60, delete "particular";

line 63, change "ross" to --cross--.

Col. 12, line 11, change "layer/on" to --layer on--.

UNITED STATES PATENT AND TRADEMARK OFFICE
CERTIFICATE OF CORRECTION

PATENT NO. : 5,107,318

DATED : April 21, 1992

INVENTOR(S) : Masao MAKIUCHI et al.

It is certified that error appears in the above-identified patent and that said Letters Patent is hereby corrected as shown below:

* Col. 13, line 21, change "embodiment" to --embodiments--.

* Col. 14, line 36, change "a" to --an--.

* Col. 16, line 11, change "electrode" to --electrodes--;
    line 66, after "123a" delete "to", after "123b" insert --to--, and change "are" to --is--;
    line 67, delete "with".

* Col. 17, line 50, change "a vicinity" to --the vicinity--.

Col. 18, line 9, change "Åas" to --Å as--;
    line 53, change ",layer" to --layer--.

Col. 20, line 56, change "a side" to --the side--;
    line 67, delete "out", and after "of the" insert --plurality of--.

Col. 21, line 27, delete comma ",";
    line 28, delete comma ",".

UNITED STATES PATENT AND TRADEMARK OFFICE
CERTIFICATE OF CORRECTION

PATENT NO. : 5,107,318

DATED : April 21, 1992

INVENTOR(S) : Masao Makiuchi, et. al.

It is certified that error appears in the above-indentified patent and that said Letters Patent is hereby corrected as shown below:

Col. 22, line 5, delete entire line;
        line 6, delete "the plurality of".

Signed and Sealed this

Fifth Day of April, 1994

Attest:

BRUCE LEHMAN

Attesting Officer      Commissioner of Patents and Trademarks